United States Patent [19]
Matsuzaki et al.

[11] Patent Number: 6,088,255
[45] Date of Patent: Jul. 11, 2000

[54] SEMICONDUCTOR DEVICE WITH PROMPT TIMING STABILIZATION

[75] Inventors: Yasurou Matsuzaki; Takaaki Suzuki, both of Kawasaki, Japan

[73] Assignee: Fujitsu Limited, Kawasaki, Japan

[21] Appl. No.: 09/137,101

[22] Filed: Aug. 20, 1998

[30]    Foreign Application Priority Data

Mar. 20, 1998  [JP]  Japan .................................. 10-072065
Apr. 9, 1998   [JP]  Japan .................................. 10-097383

[51] Int. Cl.[7] .................................................. G11C 7/00
[52] U.S. Cl. ............................................. 365/76; 365/233
[58] Field of Search ................... 365/76, 73, 75, 365/77, 233, 230.03

[56]    References Cited

U.S. PATENT DOCUMENTS 5,706,244  1/1998  Shimizu ............................. 365/230.03

*Primary Examiner*—Terrell W. Fears
*Attorney, Agent, or Firm*—Arent Fox Kintner Plotkin & Kahn

[57]    ABSTRACT

A semiconductor device includes a variable-delay circuit which adjusts a delay of an input clock signal by changing a number of delay elements having the input clock signal passing therethrough so as to generate a delayed clock signal, and a timing-stabilization circuit which changes the number of delay elements by one stage at a time in a first condition and by more than one stage at a time in a second condition to control the delay, thereby stabilizing the delayed clock signal to a desired timing.

14 Claims, 31 Drawing Sheets

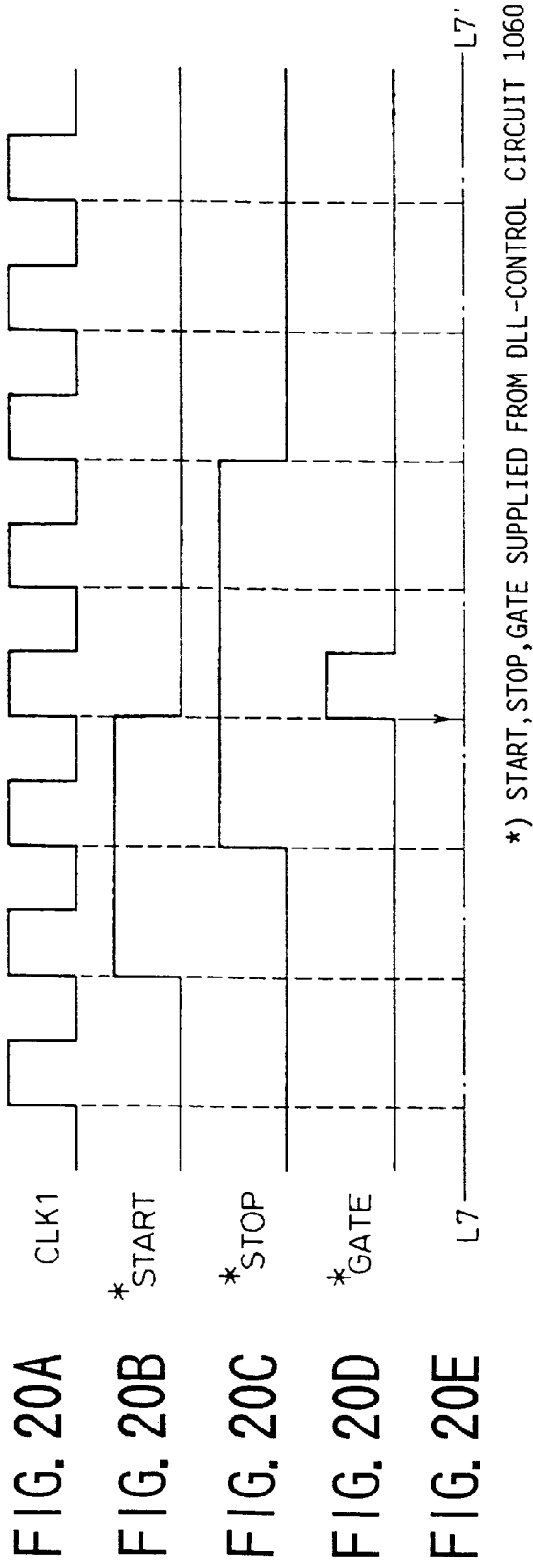

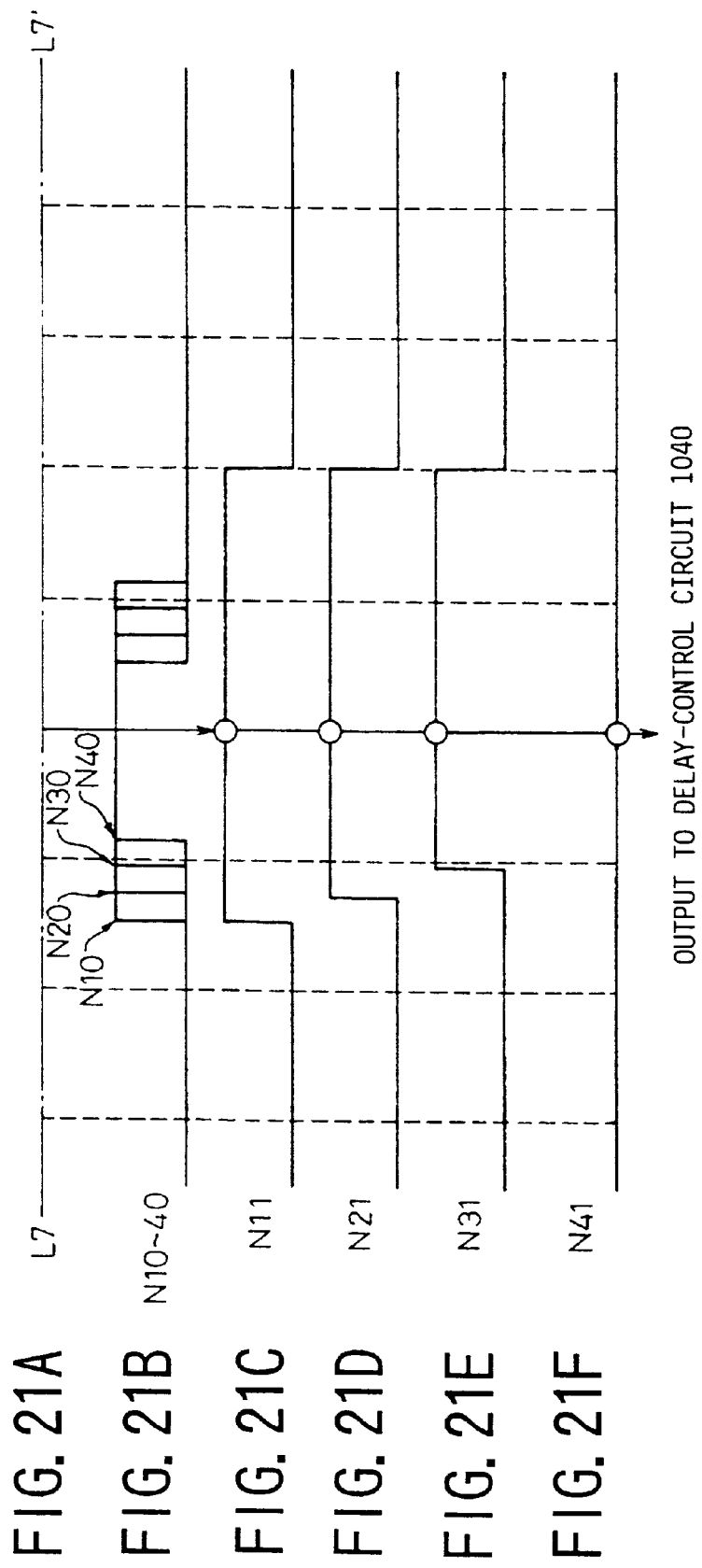

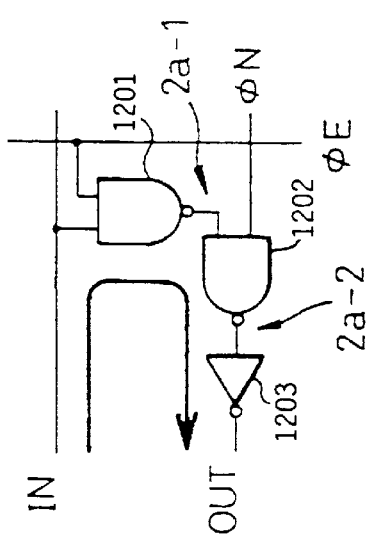

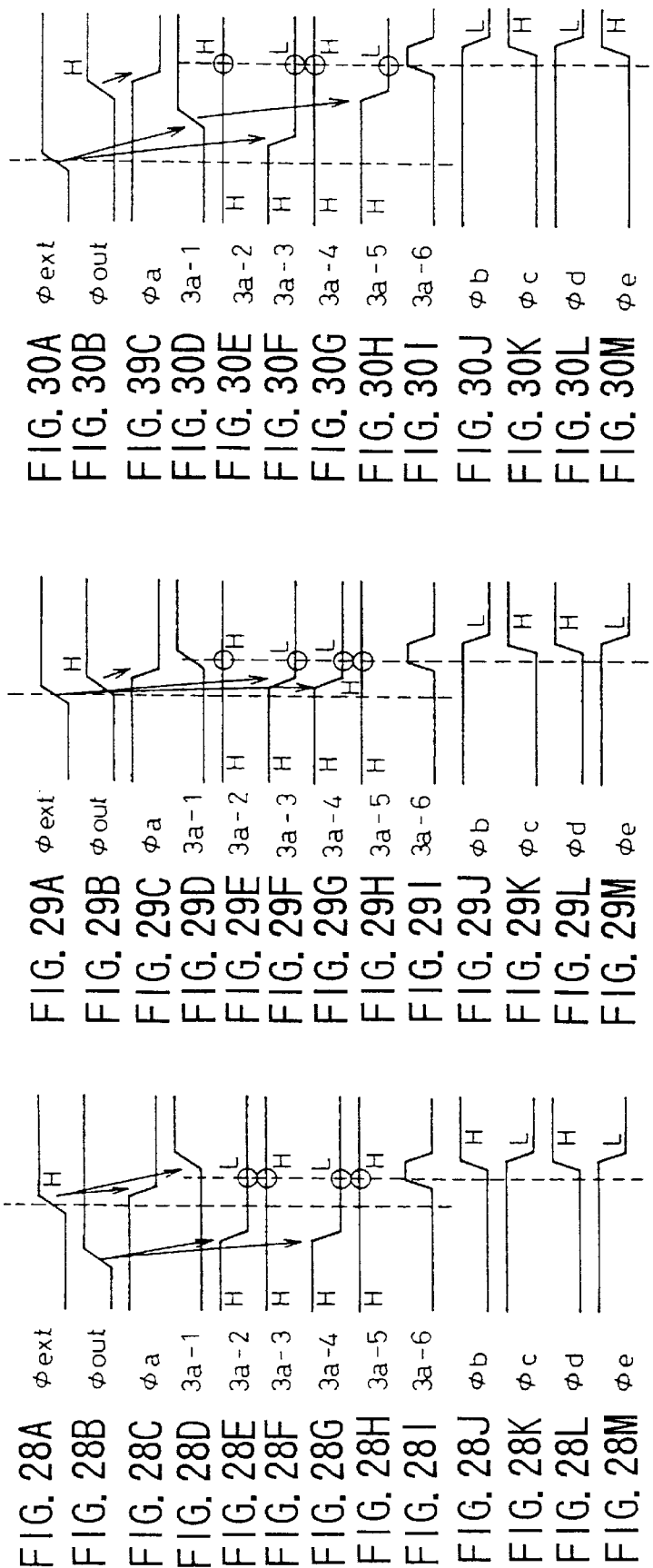

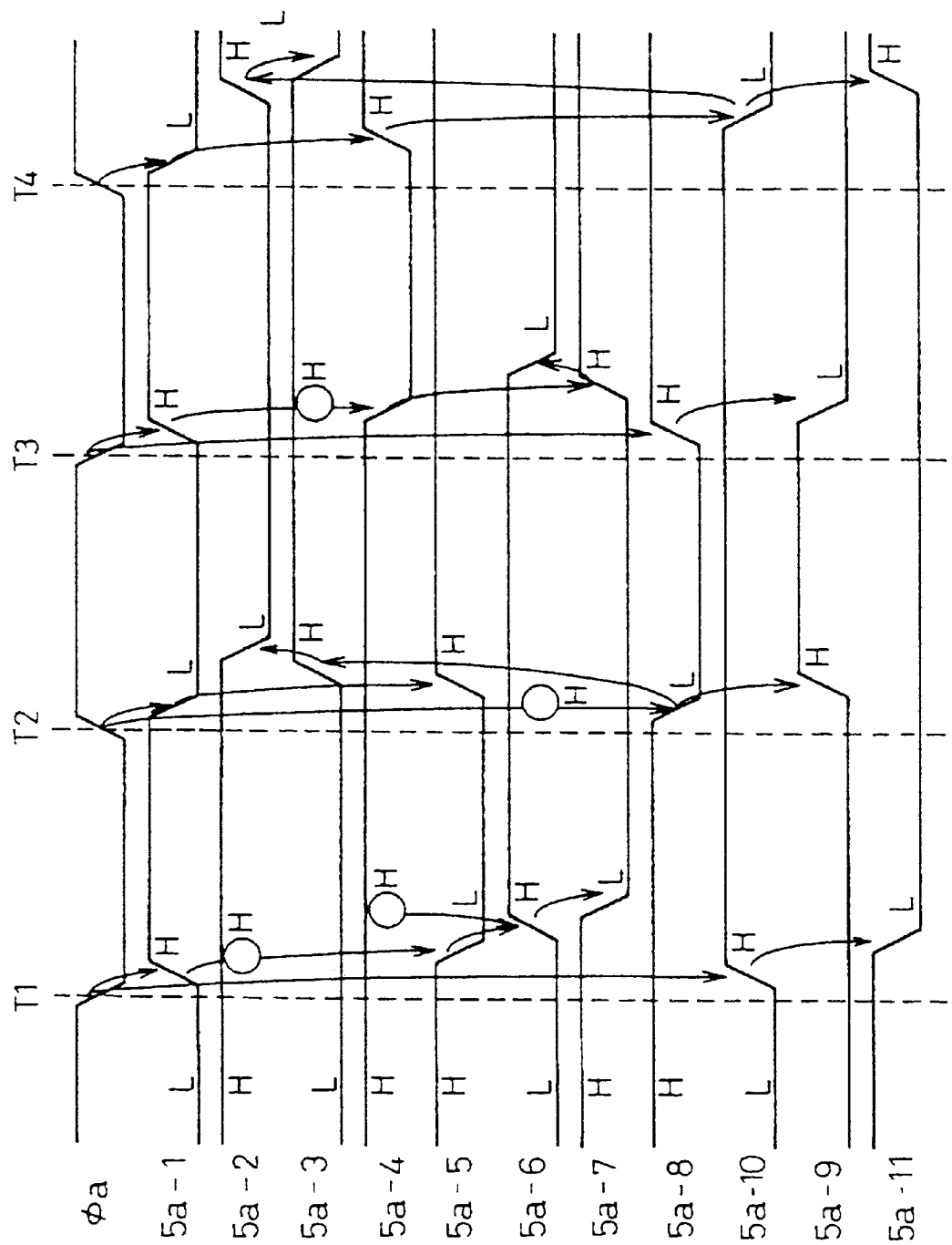

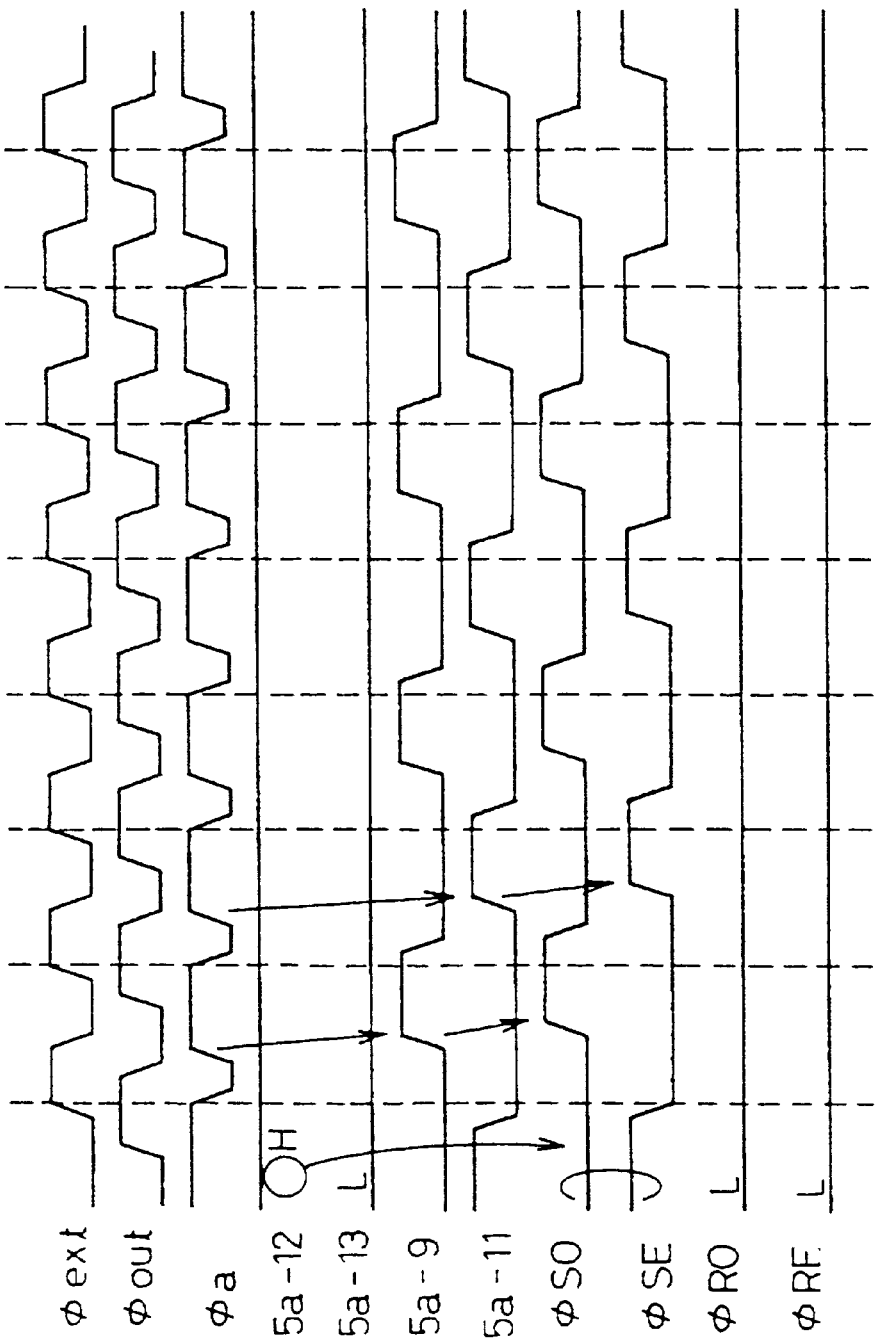

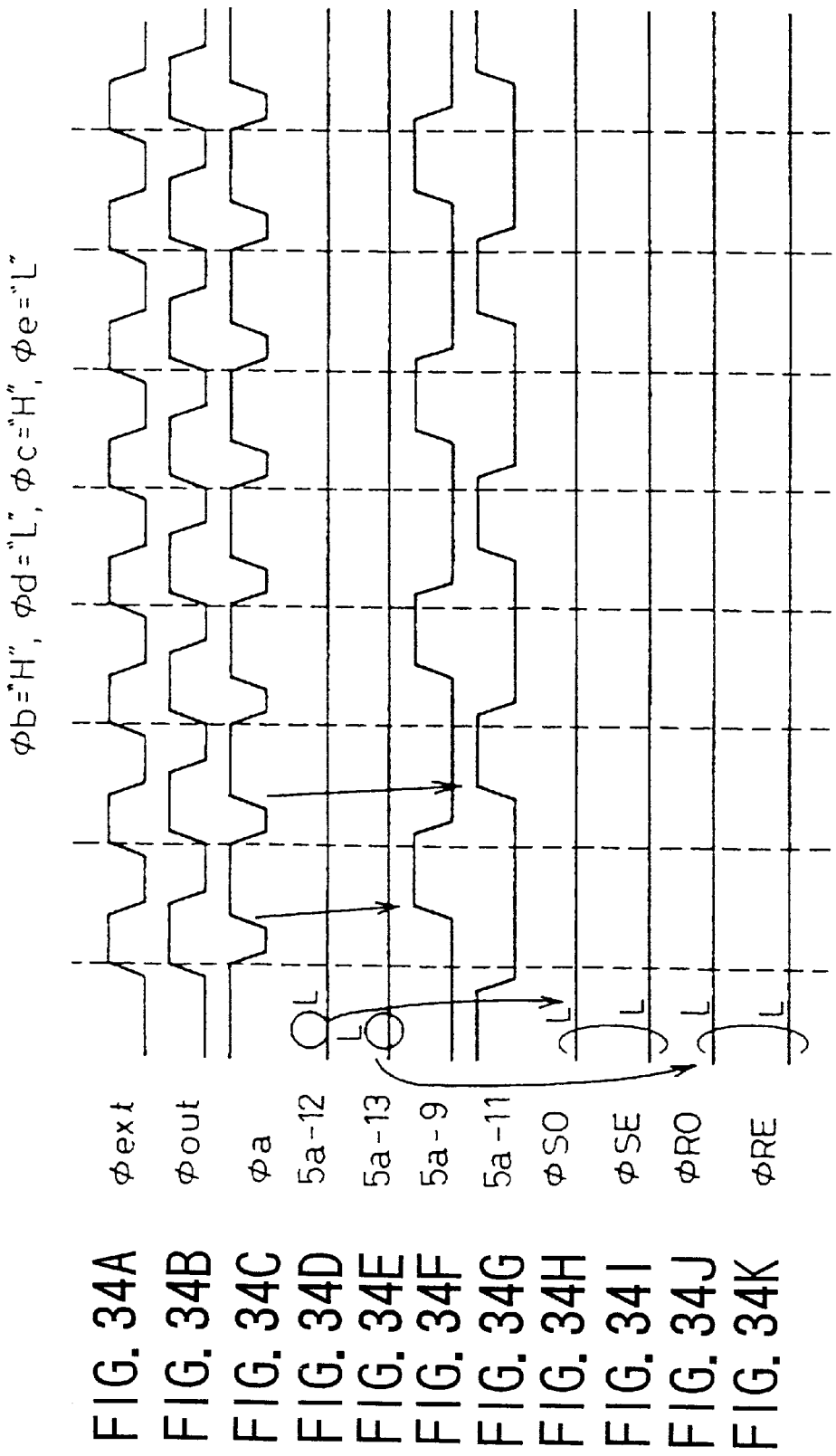

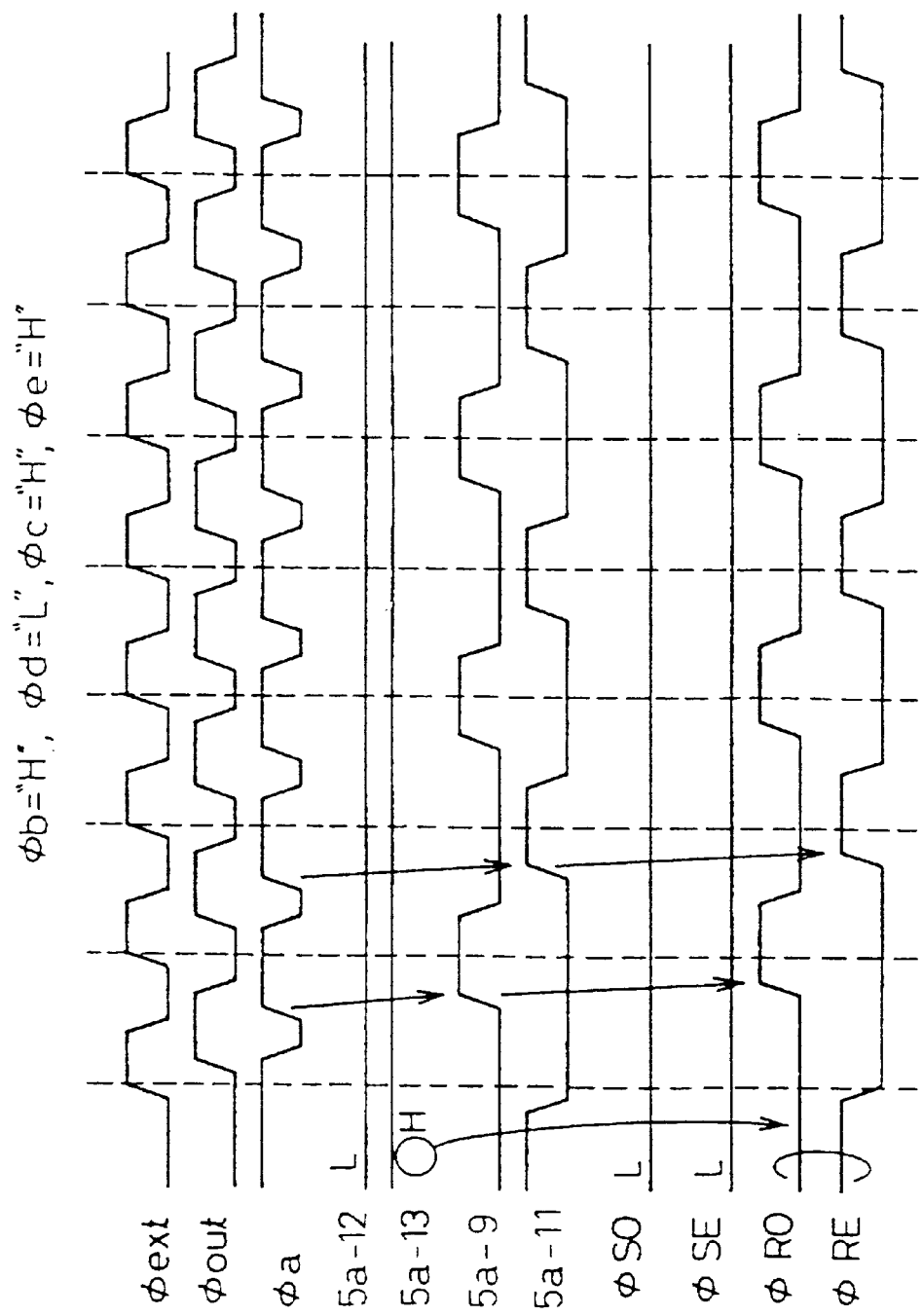

SEMICONDUCTOR DEVICE WITH PROMPT TIMING STABILIZATION

BACKGROUND OF THE INVENTION

1. Field of the Invention

The present invention generally relates to semiconductor devices, and particularly relates to a semiconductor device provided with a timing-stabilization circuit.

2. Description of the Related Art

Semiconductor devices such as SDRAMs (synchronous dynamic random access memories), which operate in synchronism with synchronization signals, require stabilization of a data-access time and a data-hold time with respect to the synchronization signals in order to achieve a higher operation speed. To meet this demand, a timing-stabilization circuit such as a DLL (delay-locked loop) circuit is provided so as to stabilize timings of internal clock signals used for data input/output.

FIG. 1 is a block diagram of a circuit which adjusts a data-output timing based on a DLL circuit.

The circuit of FIG. 1 includes an input circuit 501, a variable-delay circuit 502, an output circuit 503, a phase comparator 504, a delay-control circuit 505, a dummy-variable-delay circuit 506, a dummy-output circuit 507, and a dummy-input circuit 508.

A clock signal CLK input to the input circuit 501 is compared with a reference voltage level, and is output from the input circuit 501 as a clock signal c-clk. The clock signal c-clk is then delayed by the variable-delay circuit 502 by an appropriate delay amount, and is supplied to the output circuit 503. The output circuit 503 uses the supplied internal-clock signal as a synchronization signal for latching data DATA which is to be output from the device. The latched data DATA is then supplied from the output circuit 503 to an exterior of the semiconductor device as data DQ.

The signal path from an input node of the clock signal CLK to the output circuit 503 inevitably introduces a delay which is inherent to the circuit, so that the data DQ output to the exterior of the device has a timing displacement relative to the clock signal CLK. In order to ensure that the data DQ output from the output circuit 503 is adjusted to have a predetermined timing relation with the externally provided clock signal CLK, a DLL circuit mainly comprised of the phase comparator 504, the delay-control circuit 505, and the dummy-variable-delay circuit 506 is employed.

The clock signal c-clk is further supplied to the dummy-variable-delay circuit 506. The dummy-variable-delay circuit 506 is controlled to delay the clock signal c-clk by the same delay amount as that applied by the variable-delay circuit 502. The delayed-clock signal output from the dummy-variable-delay circuit 506 is then supplied to the dummy-output circuit 507, which emulates the output circuit 503. The clock signal output from the dummy-output circuit 507 is supplied as a dummy-clock signal d-i-clk to the phase comparator 504 via the dummy-input circuit 508, which has the same delay characteristics as the input circuit 501.

The phase comparator 504 makes a comparison of the clock signal c-clk with the dummy-clock signal d-i-clk in terms of their phases. To ensure that both clock signals have the same phase, the phase comparator 504 controls the delay amount of the dummy-variable-delay circuit 506 via the delay-control circuit 505. In this manner, the clock signal output from the dummy-output circuit 507 is adjusted so as to have a predetermined timing relation with the input clock signal CLK.

A total delay of the variable-delay circuit 502 and the output circuit 503 is equal to a total delay of the dummy-variable-delay circuit 506 and the dummy-output circuit 507. Because of this, when the clock signal output from the dummy-output circuit 507 has the predetermined timing relation with the input clock signal CLK, the data DQ output from the output circuit 503 to the exterior of the device ends up having the same predetermined timing relation with the input clock signal CLK.

In this configuration, even when the characteristics of the input circuit 501, the variable-delay circuit 502, and the output circuit 503 are changed due to variations in a power voltage and/or temperature, the characteristics of the dummy-input circuit 508, the dummy-variable-delay circuit 506, and the dummy-output circuit 507 also change in the same manner. Because of this, the data DQ output from the output circuit 503 to the exterior of the device always keeps the same timing relation with the input clock signal CLK regardless of a power-voltage variation and/or a temperature variation.

Each of the variable-delay circuit 502 and the dummy-variable-delay circuit 506 is comprised of a plurality of delay elements connected in series. When a signal is input to a first stage of the delay elements and output from a last stage of the delay elements, a signal delay commensurate with the number of delay elements from the first stage to the last stage is introduced to the signal. When a signal is input to n-th stage of the delay elements and output from the last stage, the signal is delayed by a delay length commensurate with the number of delay elements from the n-th stage to the last stage. In this manner, a delay of the output signal can be adjusted by controlling which stage of the delay elements receives the input signal. If an entry point of the input signal is shifted by one stage toward the last stage, a delay of the output signal is increased by a delay length corresponding to one stage of delay elements.

Where the clock signal c-clk and the dummy-clock signal d-i-clk are adjusted to have a 360°-phase difference, for example, a delay amount of the variable-delay circuit 502 and the dummy-variable-delay circuit 506 is shifted step by step until the 360°-phase difference is achieved (i.e., until the DLL circuit locks on). In normal active conditions of the semiconductor device, a clock cycle has a relatively small fluctuation despite a presence of variations in a power voltage and/or temperature. Because of this, the step-wise adjustment of the delay amount can cope with the fluctuation of the clock cycle.

At the time of power on, however, the variable-delay circuits are first reset to the initial state, and, then, a phase adjustment of the clock signal commences from an initial delay amount. In this case, therefore, the step-wise adjustment of the delay amount needs a lengthy time period before the DLL circuit locks on.

In a standby mode where a clock-signal frequency and/or a power voltage are lowered with an aim of reducing power consumption, the delay amount of the variable-delay circuits is quite different from that used in the normal active conditions of the device. Because of this, when the semiconductor device returns from the standby mode to the normal mode, a phase adjustment takes a lengthy time before the variable-delay circuits lock on.

Accordingly, there is a need for a semiconductor device which can reduce a time period required for a phase adjustment before a timing-stabilization circuit locks on.

SUMMARY OF THE INVENTION

Accordingly, it is a general object of the present invention to provide a semiconductor device which can satisfy the need described above.

It is another and more specific object of the present invention to provide a semiconductor device which can reduce a time period required for a phase adjustment before a timing-stabilization circuit locks on.

In order to achieve the above objects according to the present invention, a semiconductor device includes a variable-delay circuit which adjusts a delay of an input clock signal by changing a number of delay elements having the input clock signal passing therethrough so as to generate a delayed clock signal, and a timing-stabilization circuit which changes the number of delay elements by one stage at a time in a first condition and by more than one stage at a time in a second condition to control the delay, thereby stabilizing the delayed clock signal to a desired timing.

In the semiconductor device described above, when the timing-stabilization circuit adjusts a timing of the delayed clock signal, the number of delay elements is changed by one stage at a time in the first condition and by more than one stage at a time in the second condition. In the second condition, therefore, the delay is adjusted by using a relatively large shift amount so as to reduce a time required for a timing (phase) adjustment. In the first condition, further, a fine timing adjustment as was performed in the related art can be achieved.

According to one aspect of the present invention, the semiconductor device as described above is such that the timing-stabilization circuit is set to operate in the second condition in response to at least one of a start of power supply to the semiconductor device and switching of operation modes of the semiconductor device.

In the semiconductor device described above, the timing-stabilization circuit is set in the second condition when the semiconductor device is powered on and/or experiences switching of an operation mode. When a timing of the delayed clock signal is far different from a desired timing as may be so immediately after the power-on or the mode switch, therefore, a time period required for achieving the desired timing can be shortened.

According to another aspect of the present invention, the timing stabilization circuit is such that a switch is made from the second condition to the first condition when the delay comes to a predetermined proximity of a desired delay through successive shifts of more than one stage at a time in the second mode.

In the semiconductor device described above, as the delay comes sufficiently close to a desired delay, the timing-stabilization circuit is switched to the first condition so as to shift the delay one stage by one stage thereafter, so that a timing of the delayed clock signal is reliably matched with the desired timing.

According to another aspect of the present invention, the semiconductor device as described above further includes a power-on-detection circuit which detects the start of power supply to generate a signal indicative thereof, wherein the timing-stabilization circuit is set in the second condition in response to the signal from the power-on-detection circuit.

In the semiconductor device described above, the power-on-detection circuit detects the power on of the semiconductor device, and sets the timing-stabilization circuit in the second condition. When a timing of the delayed clock signal is far different from a desired timing immediately after the power on, therefore, a time period required for achieving the desired timing can be shortened.

According to another aspect of the present invention, the semiconductor device as described above further includes a return-detection circuit which detects a return from a reduced-power-consumption mode to a normal-operation mode to generate a signal indicative thereof, wherein the timing-stabilization circuit is set in the second mode in response to the signal from the return-detection circuit.

In the semiconductor device described above, the return-detection circuit detects a return from the reduced-power-consumption mode to the normal-operation mode, and sets the timing-stabilization circuit in the second condition. When a timing of the delayed clock signal is far different from a desired timing immediately after such a return, therefore, a time period required for achieving the desired timing can be shortened.

According to another aspect of the present invention, the semiconductor device as described above is such that the timing-stabilization circuit includes a dummy-variable-delay circuit which is controlled to introduce the same delay as that of the variable-delay circuit, a dummy circuit which delays a clock signal supplied from the dummy-variable-delay circuit, a phase comparator which compares phases between a clock supplied from the dummy circuit and the input clock signal, and a delay-control circuit which controls the delay based on phase comparison of the phase comparator by changing the number of delay elements by one stage in the first condition and by more than one stage in the second condition with respect to the variable-delay circuit and the dummy-variable-delay circuit.

In the semiconductor device described above, the clock signal obtained as a dummy signal is compared with the input clock signal in terms of their phases, and, based on the phase comparison, the number of delay elements is changed by one stage at a time in the first condition and by more than one stage at a time in the second condition. By adjusting a timing of the dummy clock signal in this manner, a reliable timing stabilization can be achieved with respect to the delayed clock signal which is to be used for synchronization purposes.

According to another aspect of the present invention, the semiconductor device as described above is such that the timing-stabilization circuit further includes a delay-control-switch circuit which sets the delay-control circuit in the second condition in response to at least one of the start of power supply and the switching of operation modes, and sets the delay-control circuit in the first mode in accordance with the phase comparison of the phase comparator.

In the semiconductor device described above, the delay-control circuit is switched to the first condition based on the phase comparison, so that a reliable timing adjustment can be made to achieve the desired timing.

According to another aspect of the present invention, the semiconductor device as described above is such that the delay-control-switch circuit sets the delay-control circuit in the first condition when the phase comparison of the phase comparator indicates a lock-on status or a reversal of a shift direction of the delay.

In the semiconductor device described above, the delay-control circuit is switched to the first condition when the phase comparison indicates the lock-on status of the timing-stabilization circuit or the reversal of a shift direction of the delay. A timing of the delayed clock signal is thus reliably adjusted to achieve the desired timing.

Other objects and further features of the present invention will be apparent from the following detailed description when read in conjunction with the accompanying drawings.

BRIEF DESCRIPTION OF THE DRAWINGS

FIGS. 20A through 20E are timing charts for explaining operations of the clock-cycle-measurement unit shown in FIG. 19;

FIGS. 21A through 21F are further timing charts for explaining operations of the clock-cycle-measurement unit shown in FIG. 16;

FIG. 22 is a circuit diagram showing a portion of a variable-delay circuits shown in FIG. 15;

FIGS. 23A through 23F are timing charts for explaining operations of one stage of delay elements;

FIG. 24 is a circuit diagram showing a circuit structure obtained by connecting one stage of delay elements one after another in series;

FIGS. 28A through 28M are timing charts for explaining operations of the phase-comparison unit of the phase-comparison circuit;

FIGS. 29A through 29M are further timing charts for explaining operations of the phase-comparison unit of the phase-comparison circuit;

FIGS. 30A through 30M are yet further timing charts for explaining operations of the phase-comparison unit of the phase-comparison circuit;

FIG. 32A through 32L are timing charts for explaining operations of the amplifier unit of the phase-comparison circuit;

FIG. 33A through 33K are timing charts for explaining count-up operations of the amplifier unit of the phase-comparison circuit;

FIG. 34A through 34K are timing charts for explaining count-stay operations of the amplifier unit of the phase-comparison circuit; and FIG. 35A through 35K are timing charts for explaining count-down operations of the amplifier unit of the phase-comparison circuit.

DESCRIPTION OF THE PREFERRED EMBODIMENTS

In the following, embodiments of the present invention will be described with reference to the accompanying drawings.

Figure 2:
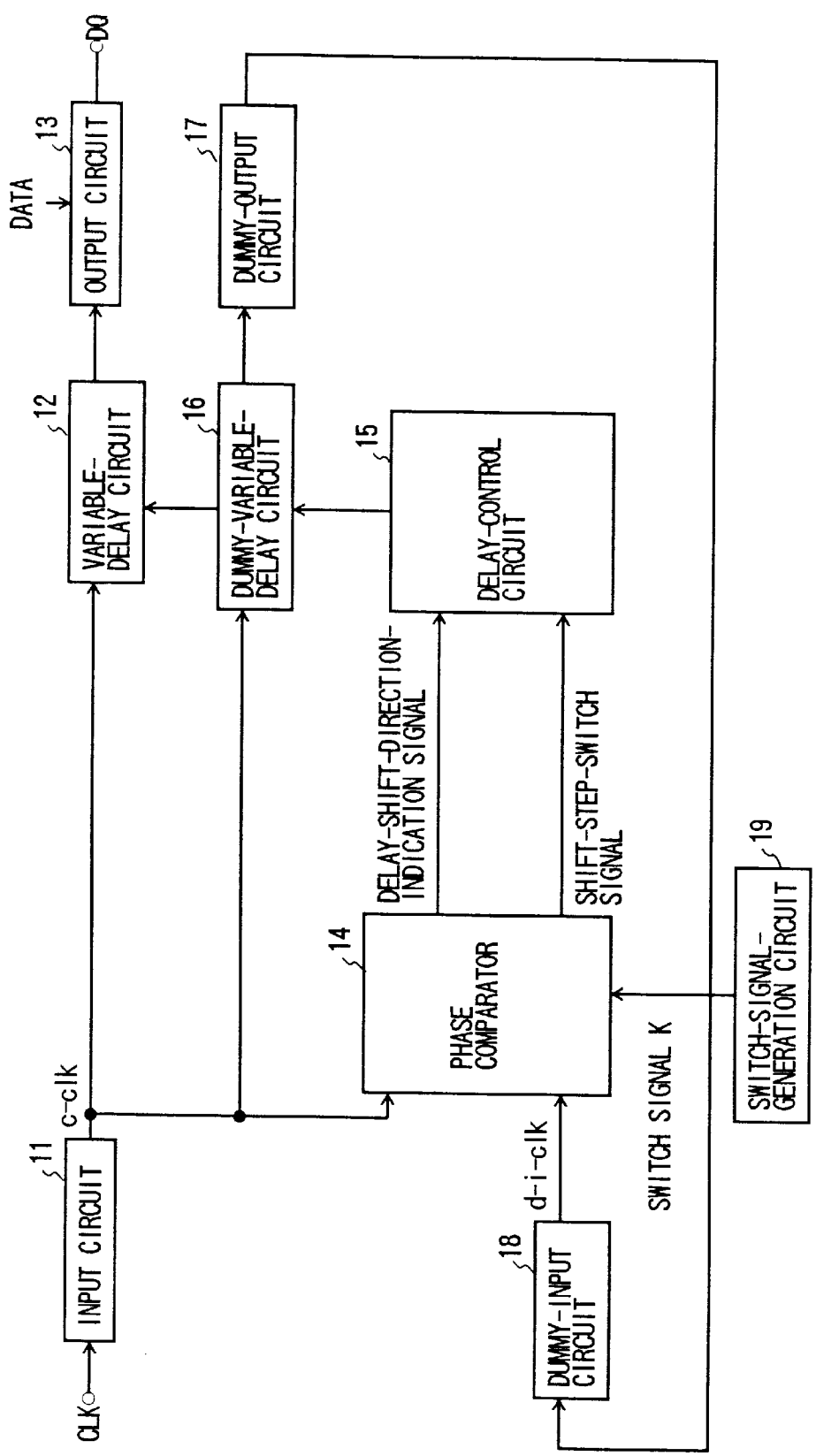
FIG. 2 is a block diagram of a semiconductor device which adjusts a data-output timing based on a DLL circuit according to the present invention.

FIG. 2 is a block diagram of a semiconductor device which adjusts a data-output timing based on a DLL circuit according to the present invention.

The semiconductor device of FIG. 2 includes an input circuit 11, a variable-delay circuit 12, an output circuit 13, a phase comparator 14, a delay-control circuit 15, a dummy-variable-delay circuit 16, a dummy-output circuit 17, a dummy-input circuit 18, and a switch-signal-generation circuit 19.

A clock signal CLK input to the input circuit 11 is compared with a reference voltage level, and is output from the input circuit 11 as a clock signal c-clk. The clock signal c-clk is then delayed by the variable-delay circuit 12 by an appropriate delay amount, and is supplied to the output circuit 13. The output circuit 13 uses the supplied internal-clock signal as a synchronization signal for latching data DATA which is to be output from the device. The latched data DATA is then supplied from the output circuit 13 to an exterior of the semiconductor device as data DQ.

The signal path from an input node of the clock signal CLK to the output circuit 13 inevitably introduces a delay which is inherent to the circuit, so that the data DQ output to the exterior of the device has a timing displacement relative to the clock signal CLK. In order to ensure that the data DQ output from the output circuit 13 is adjusted to have a predetermined timing relation with the externally provided clock signal CLK, a DLL circuit mainly comprised of the phase comparator 14, the delay-control circuit 15, and the dummy-variable-delay circuit 16 is employed.

The clock signal c-clk is further supplied to the dummy-variable-delay circuit 16. The dummy-variable-delay circuit 16 is controlled to delay the clock signal c-clk by the same delay amount as that applied by the variable-delay circuit 12. The delayed-clock signal output from the dummy-variable-delay circuit 16 is then supplied to the dummy-output circuit 17, which emulates the output circuit 13. The clock signal output from the dummy-output circuit 17 is supplied as a dummy-clock signal d-i-clk to the phase comparator 14 via the dummy-input circuit 18, which has the same delay characteristics as the input circuit 11.

The phase comparator 14 makes a comparison of the clock signal c-clk with the dummy-clock signal d-i-clk in terms of their phases. To ensure that both clock signals have the same phase, the phase comparator 14 controls the delay amount of the dummy-variable-delay circuit 16 via the delay-control circuit 15. In this manner, the clock signal output from the dummy-output circuit 17 is adjusted so as to have a predetermined timing relation with the input clock signal CLK.

A total delay of the variable-delay circuit 12 and the output circuit 13 is equal to a total delay of the dummy-variable-delay circuit 16 and the dummy-output circuit 17. Because of this, when the clock signal output from the dummy-output circuit 17 has the predetermined timing relation with the input clock signal CLK, the data DQ output from the output circuit 13 to the exterior of the device ends up having the same predetermined timing relation with the input clock signal CLK.

In this configuration, even when the characteristics of the input circuit 11, the variable-delay circuit 12, and the output circuit 13 are changed due to variations in a power voltage and/or temperature, the characteristics of the dummy-input circuit 18, the dummy-variable-delay circuit 16, and the dummy-output circuit 17 also change in the same manner. Because of this, the data DQ output from the output circuit 13 to the exterior of the device always keeps the same timing relation with the input clock signal CLK regardless of a power-voltage variation and/or a temperature variation.

Figure 1:
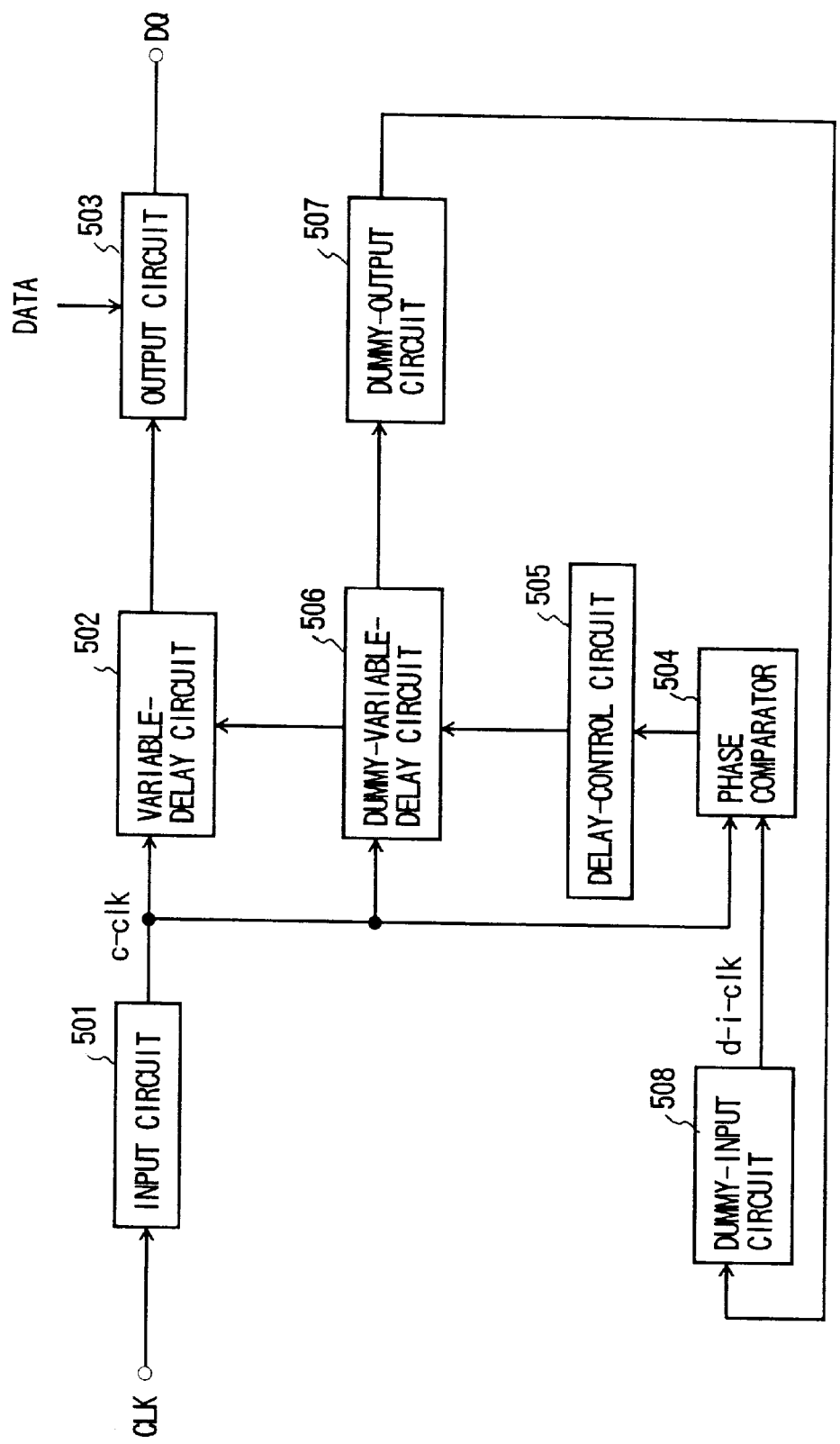
FIG. 1 is a block diagram of a related-art circuit which adjusts a data-output timing based on a DLL circuit.

Signals which the phase comparator 14 supplies to the delay-control circuit 15 include delay-shift-direction-indication signals and a shift-step-switch signal. The delay-shift-direction-indication signals are pulse signals which indicate whether the delay should be increased or decreased. The delay-shift-direction-indication signals have been used in the related art, and are supplied from the phase comparator 504 to the delay-control circuit 505 in the related-art configuration shown in FIG. 1. In the configuration of FIG. 1, only the delay-shift-direction-indication signals are used to control whether a delay is increased step by step or decreased step by step. The present invention uses the shift-step-switch signal in addition to the delay-shift-direction-indication signals, so that a selection can be made as to whether a delay is shifted by a plurality of stages of delay elements at one step or by a single stage as was the case in the related art.

Hereinafter, a scheme that shifts a delay by a single stage will be referred to as a single-shift scheme, and a scheme that shifts a delay by a plurality of stages will be referred to as a multi-shift scheme. Whether the single-shift scheme or the multi-shift scheme is employed will be determined by a switch signal K, which is supplied from the switch-signal-generation circuit 19 to the phase comparator 14.

Figure 3:
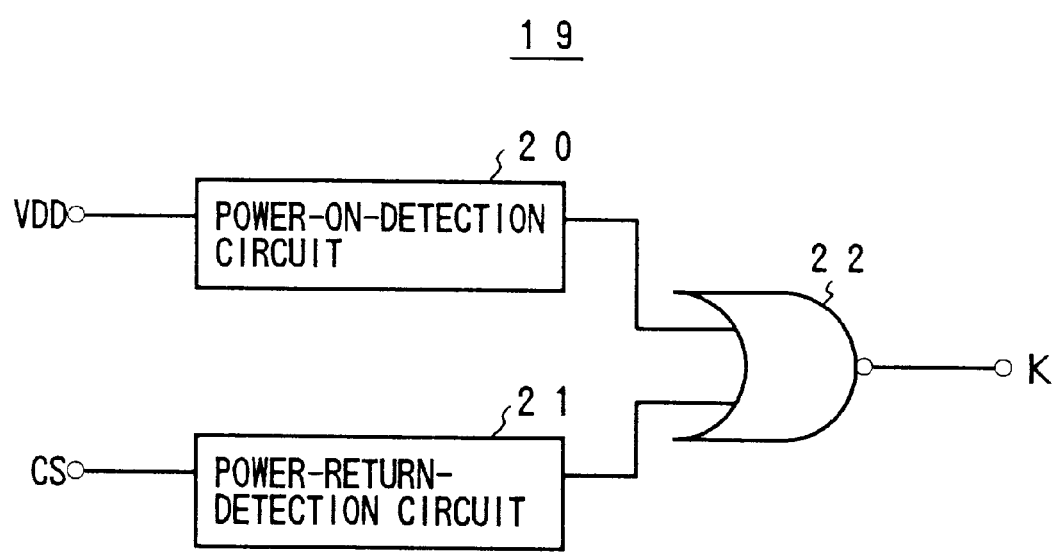
FIG. 3 is an illustrative drawing showing a configuration of a switch-signal-generation circuit which generates a switch signal.

FIG. 3 is an illustrative drawing showing a configuration of the switch-signal-generation circuit 19 which generates the switch signal K.

The switch-signal-generation circuit 19 includes a power-on-detection circuit 20, a power-return-detection circuit 21, and a NOR circuit 22. The power-on-detection circuit 20 receives a power voltage VDD, and generates a HIGH pulse when the power voltage VDD changes from 0 V to 3.3 V. The power-return-detection circuit 21 receives a chip-select signal CS, for example, and generates a HIGH pulse when the chip-select signal CS changes from LOW to HIGH. In this example, a signal level of the chip-select signal CS is used for checking whether the semiconductor device is in the power-down mode or in the normal-operation mode.

That is, a LOW chip-select signal CS indicates the power-down mode, and a HIGH chip-select signal CS specifies the normal-operation mode. Such a mode selection may be made by other control signals other than the chip-select signal CS, which is a matter of design choice. The power-on-detection circuit 20 and the power-return-detection circuit 21 have configurations which are well within ordinary skill in the art, and a description thereof will be omitted.

The HIGH pulses generated by the power-on-detection circuit 20 and the power-return-detection circuit 21 are supplied to the NOR circuit 22. An output of the NOR circuit 22 is supplied to the phase comparator 14 of FIG. 2 as the switch signal K. Namely, a LOW pulse is supplied to the phase comparator 14 as the switch signal K when power is turned on or when a return from the power-down mode is made.

Figure 4:
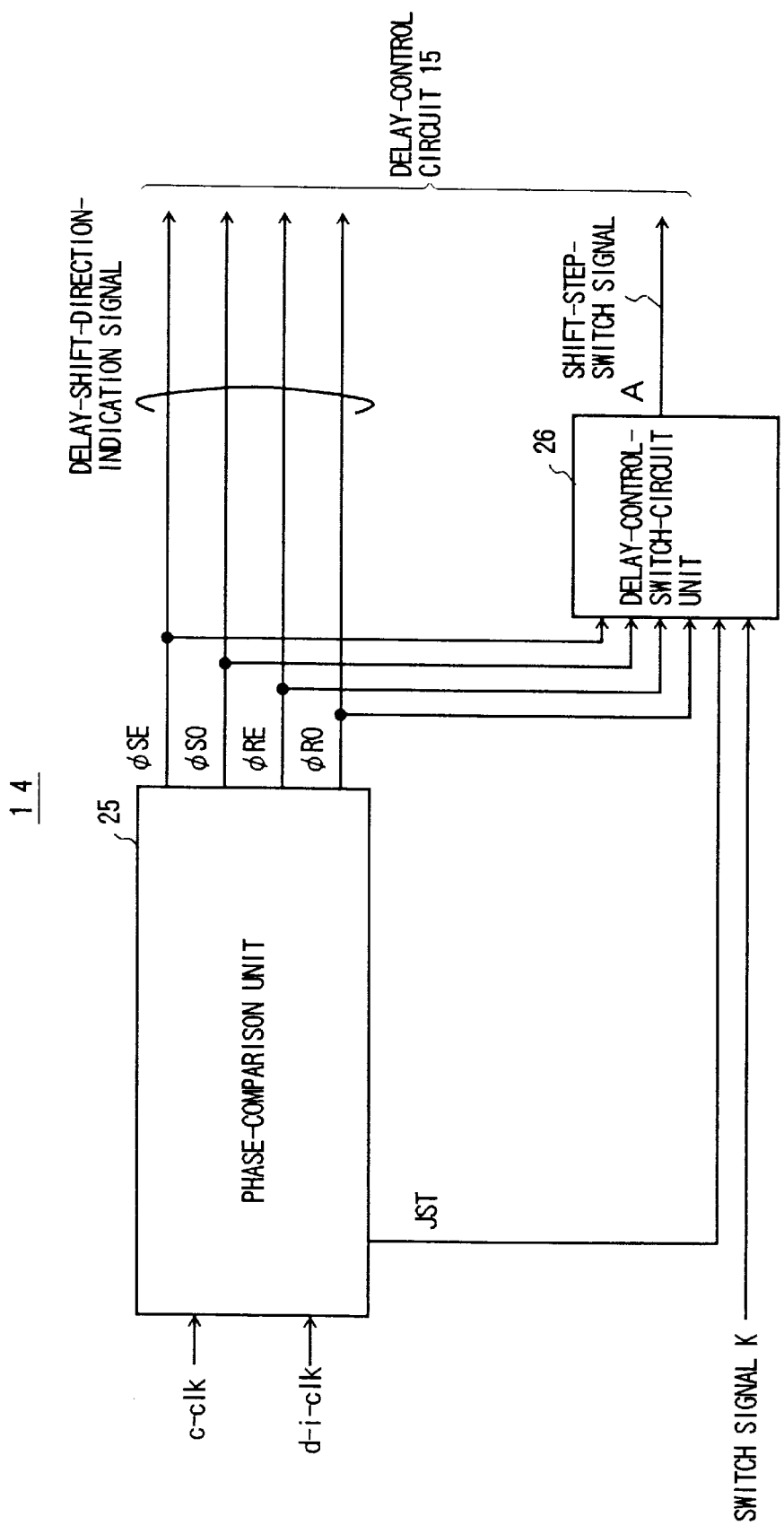
FIG. 4 is a block diagram showing a configuration of a phase comparator.

FIG. 4 is a block diagram showing a configuration of the phase comparator 14.

The phase comparator 14 includes a phase-comparison unit 25 and a delay-control-switch-circuit unit 26.

The phase-comparison unit 25 compares phases between the clock signal c-clk and the dummy-clock signal d-i-clk, and outputs delay-shift-direction-indication signals ΦSE, ΦSO, ΦRE, and ΦRO, which indicates whether the delay should be increased or decreased. The delay-shift-direction-indication signals ΦSE and ΦSO exhibit HIGH pulses in turn when the delay should be increased, whereas the delay-shift-direction-indication signals ΦRE and ΦRO exhibit HIGH pulses in turn when the delay should be decreased. The phase-comparison unit 25 further generates a lock-on signal JST indicating a lock-on status of the DLL circuit (i.e., indicating a stabilized timing) when the clock signal c-clk and the dummy-clock signal d-i-clk have the same phase.

The delay-control-switch-circuit unit 26 receives the switch signal K from the switch-signal-generation circuit 19 of FIG. 2, and further receives the delay-shift-direction-indication signals ΦSE, ΦSO, ΦRE, and ΦRO and the lock-on signal JST from the phase-comparison unit 25. Based on these received signals, the delay-control-switch-circuit unit 26 outputs a shift-step-switch signal A. The shift-step-switch signal A indicates, as previously described, whether the delay is shifted by a plurality of stages of the delay elements at one step or by a signal stage as was so in the related art.

The delay-shift-direction-indication signals ΦSE, ΦSO, ΦRE, and ΦRO and the shift-step-switch signal A are supplied to the delay-control circuit 15 of FIG. 2.

Figure 5:
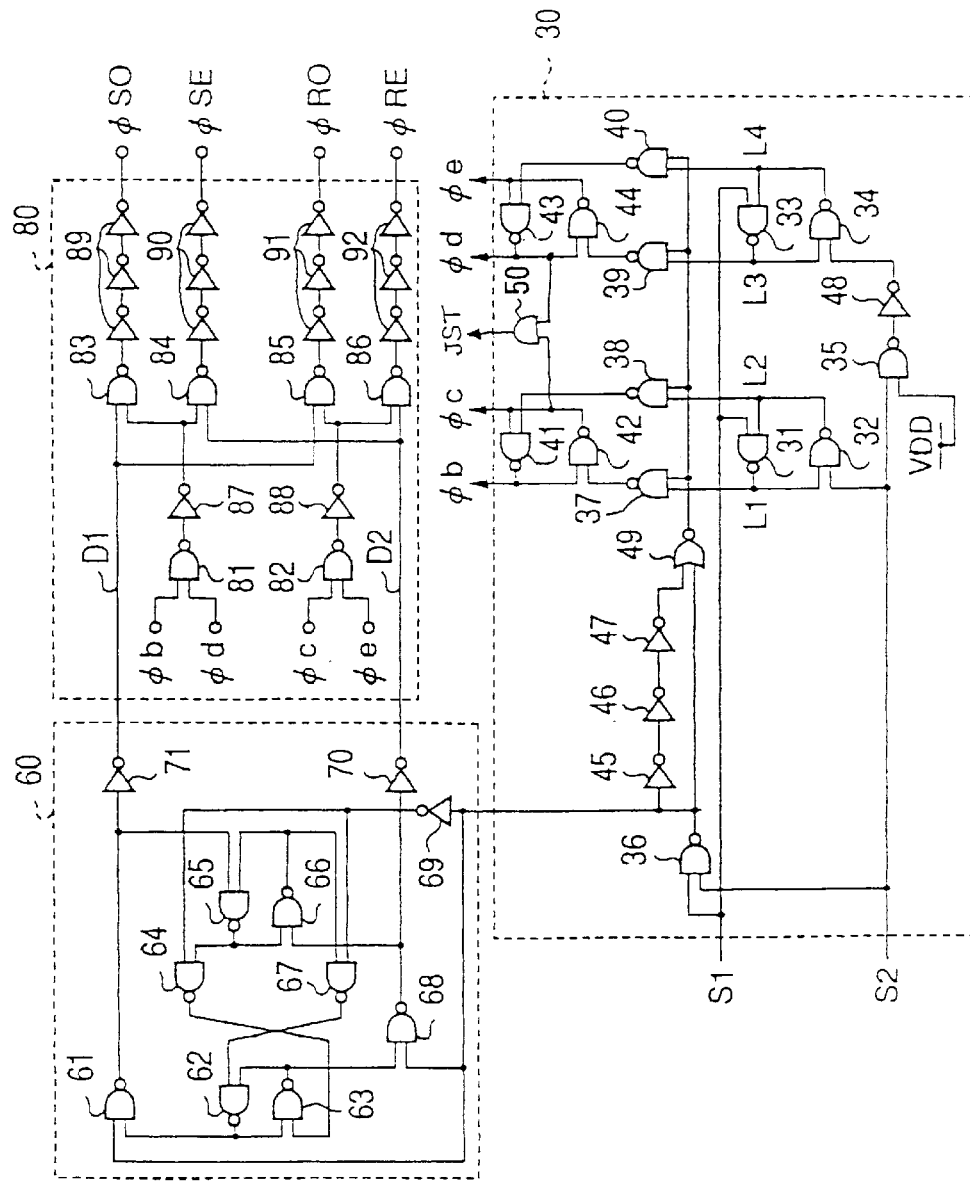
FIG. 5 is a circuit diagram showing a circuit configuration of a phase-comparison unit.

FIG. 5 is a circuit diagram showing a circuit configuration of the phase-comparison unit 25.

The phase-comparison unit 25 of FIG. 5 includes an edge-timing-comparison circuit 30, a binary counter 60, and a pulse-generation circuit 80.

The edge-timing-comparison circuit 30 includes NAND circuits 31 through 44, inverters 45 through 48, a NOR circuit 49, and an AND circuit 50. The binary counter 60 includes NAND circuits 61 through 68 and inverters 69 through 71. The pulse-generation circuit 80 includes NAND circuits 81 through 86 and inverters 87 through 92.

The edge-timing-comparison circuit 30 receives input signals S1 and S2, and determines which one of the input signals S1 and S2 has a rising edge ahead of the other. One of the input signals S1 and S2 corresponds to the dummy-clock signal d-i-clk, and the other corresponds to the clock signal c-clk.

If a rising edge of the input signal S1 is ahead of a rising edge of the input signal S2, a latch comprised of the NAND circuits 31 and 32 produces outputs L1 and L2 which are LOW and HIGH, respectively. Also, a latch formed by the NAND circuits 33 and 34 generates output L3 and L4 which are LOW and HIGH, respectively.

After this, both of the input signals S1 and S2 become HIGH, which changes an output of the NAND circuit 36 to LOW. This prompts the NOR circuit 49 to produce a HIGH output for a predetermined period of time. The HIGH output of the NOR circuit 49 opens gates of the NAND circuits 37 through 40, so that the latch outputs L1 through L4 are inverted and input to two latches comprised of NAND circuits 41 through 44. The latch comprised of NAND circuits 41 and 42 thus has outputs $\Phi$b and $\Phi$c which are HIGH and LOW, respectively. Also, the latch comprised of NAND circuits 43 and 44 has outputs $\Phi$d and $\Phi$e which are HIGH and LOW, respectively.

In this manner, when the input signal S1 has a rising edge ahead in time, the NAND circuit 81 of the pulse-generation circuit 80 changes an output thereof to LOW.

When a rising edge of the input signal S2 is ahead of a rising edge of the input signal S1 by a sufficient margin, the latch outputs $\Phi$b and $\Phi$c become LOW and HIGH, respectively, and, also, the latch outputs $\Phi$d and $\Phi$e become LOW and HIGH, respectively. In this case, therefore, the NAND circuit 82 of the pulse-generation circuit 80 changes an output thereof to LOW.

When a rising edge of the input signal S2 is ahead of a rising edge of the input signal S1 only by a small margin, the latch comprised of the NAND circuits 33 and 34 produces the outputs L3 and L4 which are LOW and HIGH, respectively, because of a signal delay introduced by the NAND circuit 35 and the inverter 48. In this case, the latch outputs $\Phi$b and $\Phi$c are LOW and HIGH, respectively, whereas the latch outputs $\Phi$d and $\Phi$e are HIGH and LOW, respectively. The NAND circuits 81 and 82 of the pulse-generation circuit 80 thus do not change outputs thereof, and these outputs remain at the HIGH level.

In this manner, when a difference in rising-edge timings is small between the input signal S1 and the input signal S2, i.e., when the rising edges can be regarded as having the same timing, the phase-comparison unit 25 of FIG. 5 does not generate an output.

The binary counter 60 divides a frequency of a signal by half when receiving the signal from the NAND circuit 36 of the edge-timing-comparison circuit 30. The binary counter 60 outputs a frequency-divided signal D1 from the inverter 71, and outputs a frequency-divided signal D2 from the inverter 70. The signal from the NAND circuit 36 has the same cycle as the input signals S1 and S2. Because of this, the frequency-divided signal D1 output from the binary counter 60 becomes HIGH during even-number cycles of the input signals, for example. In this case, the frequency-divided signal D2 becomes HIGH during odd-number cycles.

In the pulse-generation circuit 80, the output of the NAND circuit 81 becomes LOW when the input signal S1 is ahead of the input signal S2, as previously described. On the other hand, when the input signal S2 is ahead in time by a sufficient margin, the output of the NAND circuit 82 becomes LOW.

When the input signal S1 is ahead in time, the output of the NAND circuit 81 is inverted by the inverter 87, and is supplied to the NAND circuit 83 and 84 as a HIGH signal. The NAND circuit 83 further receives the frequency-divided signal D1, and the NAND circuit 84 further receives the frequency-divided signal D2. In this case, therefore, the pulse-generation circuit 80 generates HIGH pulses as the signal $\Phi$SE or the signal $\Phi$SO in turn.

When the input signal S2 is ahead in time by a sufficient margin, the output of the NAND circuit 82 is inverted by the inverter 88, and is supplied to the NAND circuit 85 and 86 as a HIGH signal. The NAND circuit 85 further receives the frequency-divided signal D1, and the NAND circuit 86 further receives the frequency-divided signal D2. In this case, therefore, the pulse-generation circuit 80 generates HIGH pulses as the signal $\Phi$RO and the signal $\Phi$RE in turn.

The AND circuit 50 of the edge-timing-comparison circuit 30 receives the signals $\Phi$c and $\Phi$d as two inputs thereto. As previously described, the signals $\Phi$c and $\Phi$d are HIGH at the same time when the edge-timing-comparison circuit 30 compares signal timings between two signals and finds that a timing difference between these two signals falls within a predetermined range. This indicates that the clock signal is locked on.

Accordingly, the AND circuit 50 receiving the signals $\Phi$c and $\Phi$d in the edge-timing-comparison circuit 30 generates a HIGH signal as the lock-on signal JST when the clock signal is locked on.

Figure 6:
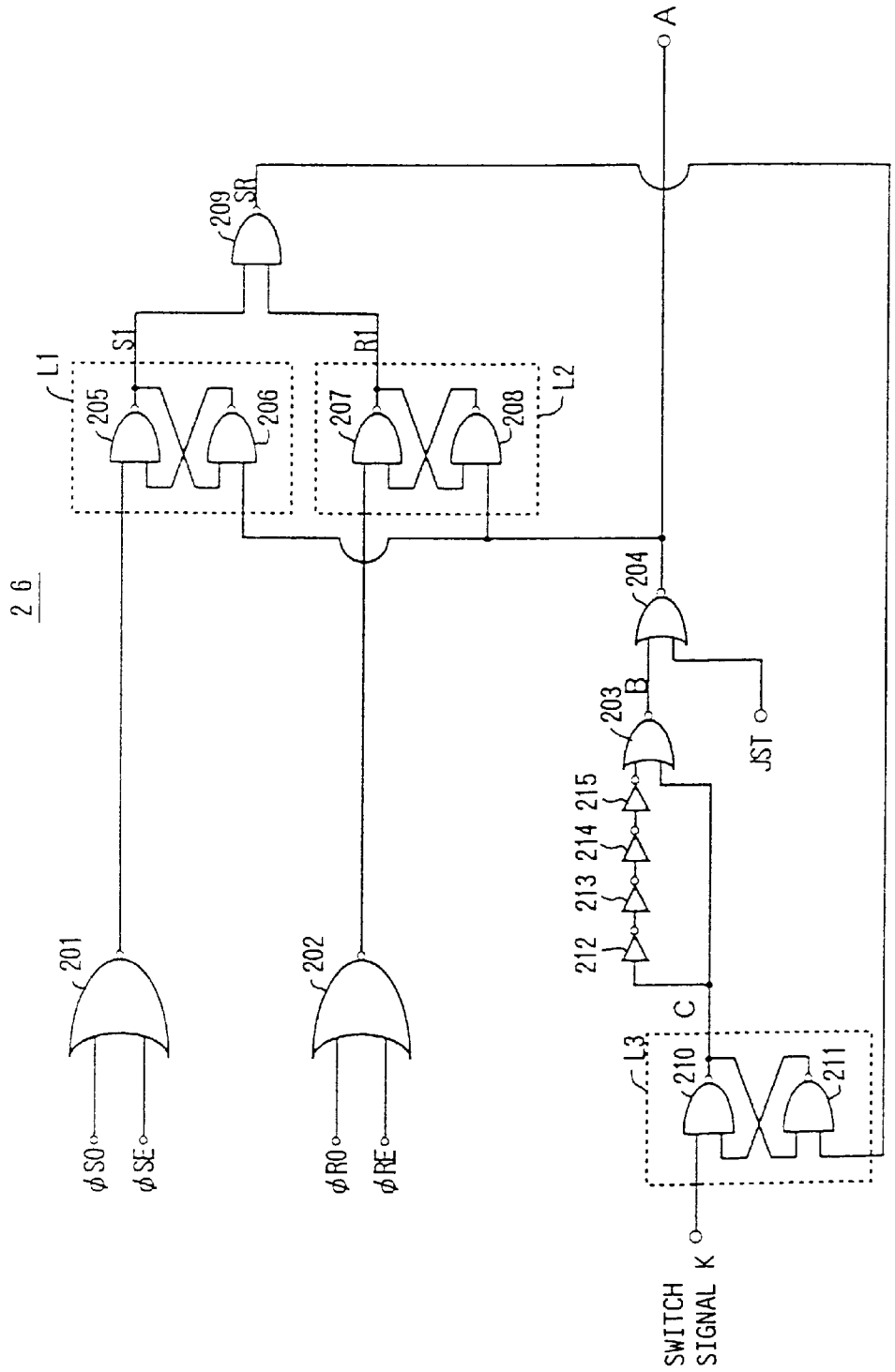
FIG. 6 is a circuit diagram showing a circuit structure of a delay-control-switch-circuit unit.
Figure 7:
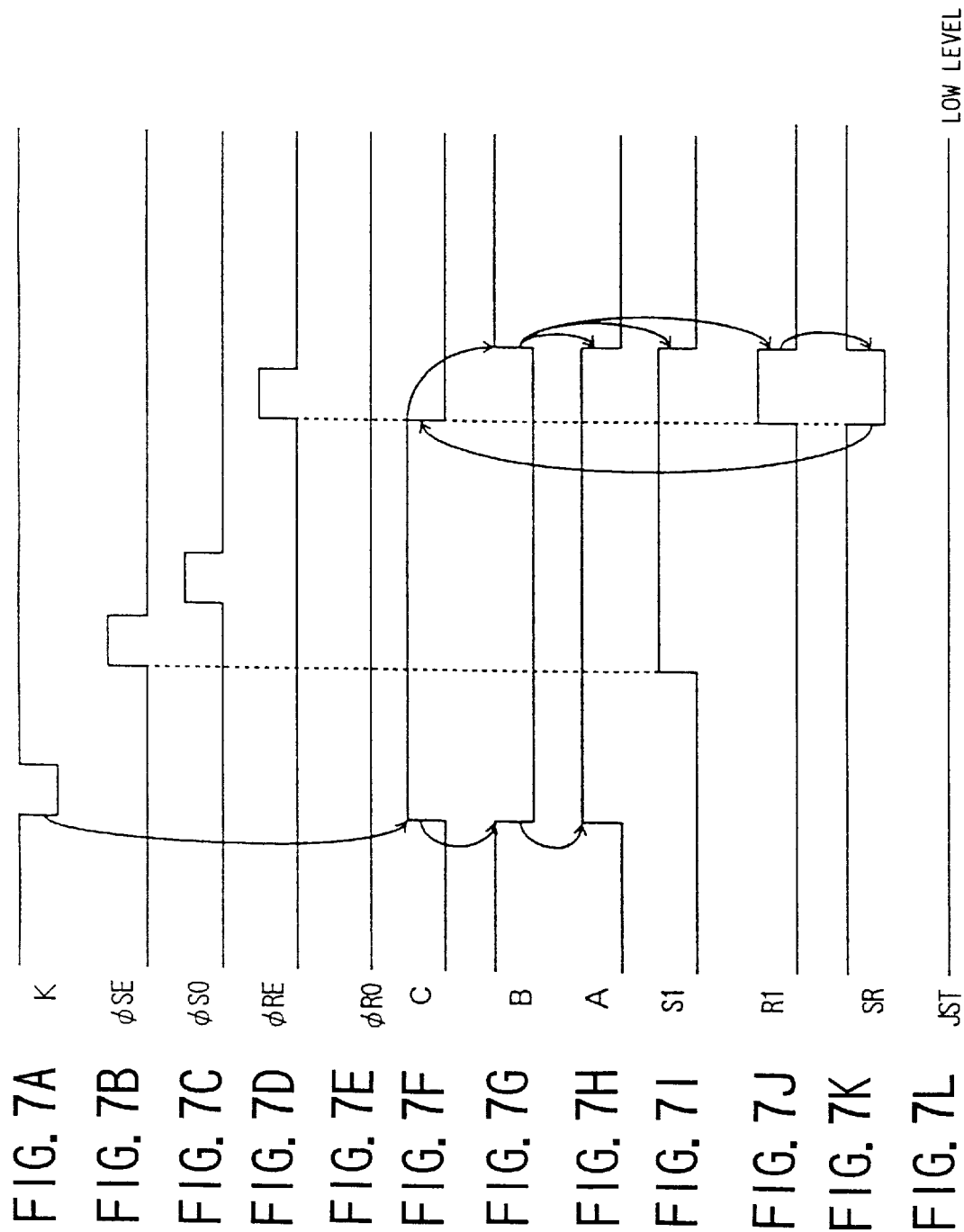
FIGS. 7A through 7L are timing charts showing operations of the delay-control-switch-circuit unit.

FIG. 6 is a circuit diagram showing a circuit structure of the delay-control-switch-circuit unit 26. FIGS. 7A through 7L are timing charts showing operations of the delay-control-switch-circuit unit 26.

The delay-control-switch-circuit unit 26 as shown in FIG. 6 includes NOR circuits 201 through 204, NAND circuits 205 through 211, and inverters 212 through 215. The NAND circuits 205 and 206 together form a latch L1, and the NAND circuits 207 and 208 together make up a latch L2. Further, the NAND circuits 210 and 211 together form a latch L3. The latch L1 latches a signal S1 to HIGH when a HIGH pulse is supplied thereto as one of the delay-shift-direction-indication signals $\Phi$SE and $\Phi$SO. The latch L2 latches a signal R1 to HIGH when a HIGH pulse is supplied thereto as one of the delay-shift-direction-indication signals $\Phi$RE and $\Phi$RO. The latch L3 latches a signal C to HIGH so as to engage in a multi-shift scheme for shifting a delay by multiple stages when a LOW pulse is supplied thereto as the switch signal K.

In what follows, operations of the delay-control-switch-circuit unit 26 will be described with reference to FIG. 6 and FIGS. 7A through 7L.

At an initial state, the latches L1 and L2 keep the respective outputs S1 and R1 thereof at a LOW level. In this case, a signal SR output from the NAND circuit 209 is HIGH. At this initial state, also, the latch L3 keeps the output C thereof at a LOW level. When a LOW pulse of the switch signal K is supplied to the latch L3, the latch L3 latches the output C to HIGH. This makes a change to LOW in a signal B, so that the shift-step-switch signal A output from the NOR circuit 204 becomes HIGH. The HIGH level of the shift-step-switch signal A indicates that the multi-shift scheme is engaged.

As the delay-shift-direction-indication signal $\Phi$SE (or $\Phi$SO) is input, the latch L1 latches the output S1 thereof to HIGH. Since the delay should be increased as fast as possible to reach a lock-on status during when the delay-shift-direction-indication signals $\Phi$SE and $\Phi$SO are being supplied, the shift-step-switch signal A indicating use of the multi-shift scheme remains at the HIGH level. That is, as long as the delay-shift-direction-indication signals $\Phi$SE and $\Phi$SO are being supplied, the multi-shift scheme is engaged.

When the delay amount exceeds an appropriate delay for the lock-on status (multiple-stage shifts in the multi-shift scheme may result in the delay exceeding the appropriate delay for the lock-on status), the delay-shift-direction-indication signal ΦRE (or ΦRO) is supplied to decrease the delay, thereby counteracting too large a delay. When this delay-shift-direction-indication signal ΦRE (or ΦRO) is supplied, the latch L2 latches the output R1 thereof to HIGH. In response, the output SR of the NAND circuit 209 is changed to LOW, so that the condition of the larch L3 is reversed. Namely, the output C of the larch L3 returns to LOW. Following this change, the signal B returns to HIGH after a time period commensurate to a total delay of the delay elements (inverters) 212 through 215 passes. As a result, the shift-step-switch signal A is changed back to LOW.

Namely, when the delay becomes too large because of the multi-shift scheme so as to give rise to a need for a decrease in the delay, the shift-step-switch signal A is changed to LOW to employ the single-shift scheme. Here, the latches L1 and L2 are set to the initial state thereof when the shift-step-switch signal A becomes LOW.

In this manner, the multi-shift scheme is employed to shift the delay as fast as possible until the delay comes close to the lock-on status, and the single-shift scheme is employed once the delay reaches a proximity of the lock-on status so as to shift the delay one stage by one stage thereafter. This makes it possible to establish a reliable lock-on status of the DLL circuit in a relatively short time period.

As shown in FIG. 6, the lock-on signal JST is supplied to one of the two inputs to the NOR circuit 204. If the lock-on status is timely achieved via the multi-shift scheme, therefore, the change to HIGH of the lock-on signal JST brings the shift-step-switch signal A output from the NOR circuit 204 to LOW, thereby initiating a switch to the single-shift scheme.

Figure 8:
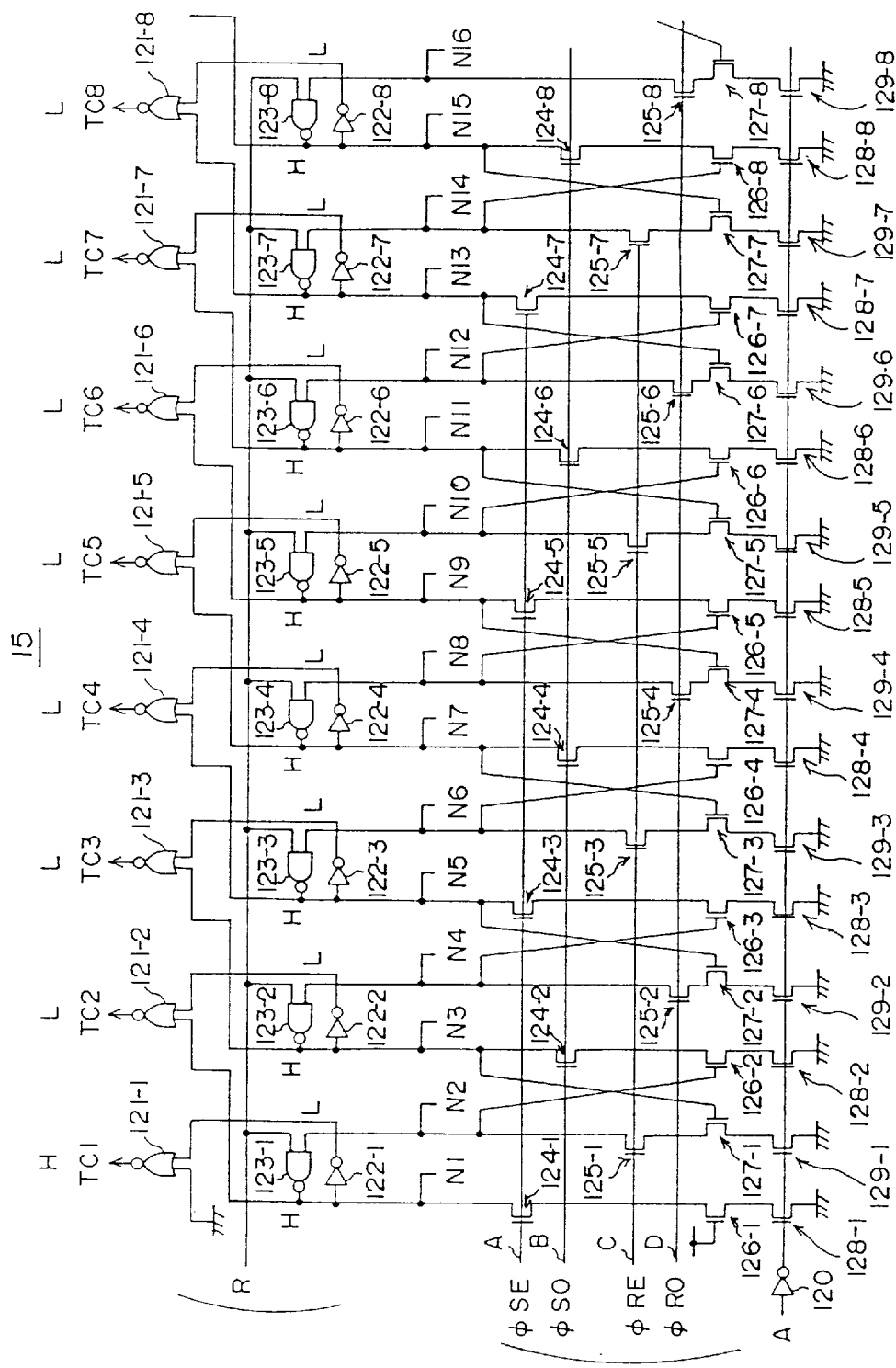
FIG. 8 is a circuit diagram showing a portion of a circuit structure of a delay-control circuit.
Figure 9:
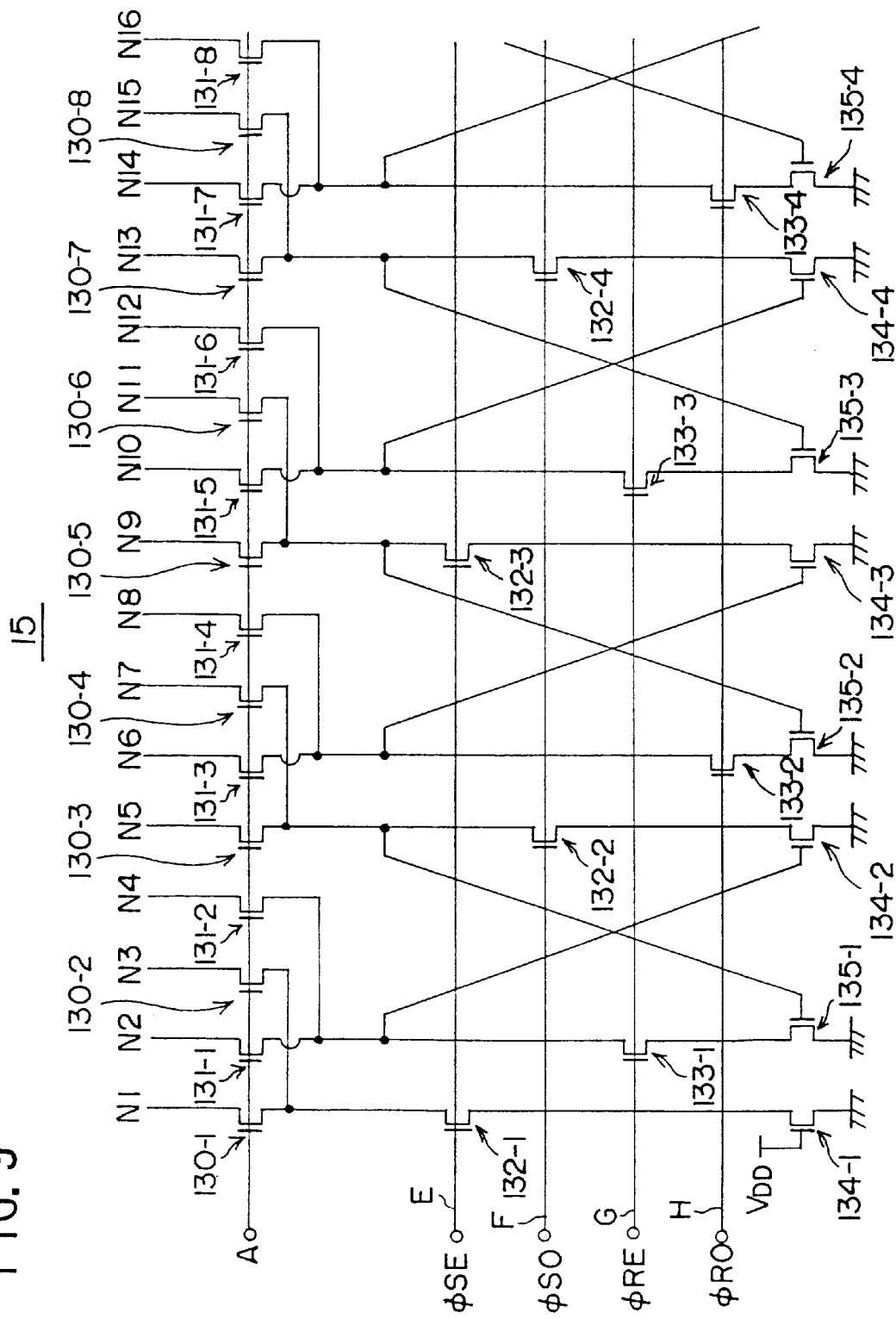
FIG. 9 is a circuit diagram showing a remaining portion of the circuit structure of the delay-control circuit.

FIG. 8 is a circuit diagram showing a portion of a circuit structure of the delay-control circuit 15. FIG. 9 is a circuit diagram showing a remaining portion of the circuit structure of the delay-control circuit 15. The delay-control circuit 15 receives the delay-shift-direction-indication signals ΦSE, ΦSO, ΦRE, and ΦRO and the shift-step-switch signal A from the phase comparator 14, and generates signals TC1 through TC8 which are used for controlling the variable-delay circuits.

A portion of the delay-control circuit 15 shown in FIG. 8 includes an inverter 120, NOR circuits 121-1 through 121-8, inverters 122-1 through 122-8, NAND circuits 123-1 through 123-8, NMOS transistors 124-1 through 124-8, NMOS transistors 125-1 through 125-8, NMOS transistors 126-1 through 126-8, NMOS transistors 127-1 through 127-8, NMOS transistors 128-1 through 128-8, and NMOS transistors 129-1 through 129-8.

The remaining portion of the delay-control circuit 15 shown in FIG. 9 includes NMOS transistors 130-1 through 130-8, NMOS transistors 131-1 through 131-8, NMOS transistors 132-1 through 132-4, NMOS transistors 133-1 through 133-4, NMOS transistors 134-1 through 134-4, and NMOS transistors 135-1 through 135-4. Signals N1 through N16 output from the circuit portion shown in FIG. 9 are supplied to the circuit portion shown in FIG. 8.

FIGS. 8 and 9 show a circuit configuration corresponding to eight stages of delay elements of the variable-delay circuits. In practice, where a total of 256 stages of delay elements are employed, for example, the configuration of FIGS. 8 and 9 is repeated to the left side of the figures so as to provide 256 stages in the delay-control circuit.

With reference to FIG. 8, a description will be give with regard to a case where the shift-step-switch signal A is LOW, i.e., where the single-shift scheme is employed.

In this case, an output of the inverter 120 becomes HIGH since it receives the shift-step-switch signal A as an input thereto. The NMOS transistors 128-1 through 128-8 and the NMOS transistors 129-1 through 129-8 are all turned on. In this case, the NMOS transistors 130-1 through 130-8 and the NMOS transistors 131-1 through 131-8 are all turned off, so that the signals N1 through N16 do not affect operations of the circuit of FIG. 8.

In FIG. 8, when a reset signal R is turned to LOW, the delay-control circuit 15 is reset. Namely, when the reset signal R becomes LOW, outputs of the NAND circuits 123-1 through 123-8 become HIGH, and outputs of the inverters 122-1 through 122-8 become LOW. A pair of a given one of the NAND circuits 123-1 through 123-8 and a corresponding one of the inverters 122-1 through 122-8 forms a latch in which one element of the pair receives an output of the other element as an input. An initial state created by the reset signal R is thus kept even after the reset signal R returns to HIGH.

In this initial state, the output TC1 of the NOR circuit 121-1 is HIGH as shown in FIG. 8, and the remaining NOR circuits 121-2 through 121-8 have the outputs TC2 through TC8, respectively, which are LOW. That is, only the output TC1 is HIGH among the outputs TC1 through TC8.

When there is a need to increase the amount of delay with respect to a signal subjected to phase adjustment, HIGH pulses are supplied to signal lines A and B in turn. With a HIGH pulse of the signal ΦSE supplied to the signal line A, the NMOS transistor 124-1 is turned on. Since the NMOS transistor 126-1 is in a turned-on state, an output of the NAND circuit 123-1 is connected to the ground, and is forced to change from HIGH to LOW, so that an output of the inverter 122-1 becomes HIGH. This condition is latched by the latch comprising the NAND circuit 123-1 and the inverter 122-1. As a result, the output TC1 is changed from HIGH to LOW, and the output TC2 is changed from LOW to HIGH. In this condition, therefore, only the output TC2 is HIGH.

With a HIGH pulse of the signal ΦSO supplied to the signal line B, the NMOS transistor 124-2 is turned on. Since the NMOS transistor 126-2 is already in a turned-on state, an output of the NAND circuit 123-2 is connected to the ground, and is forced to change from HIGH to LOW, so that an output of the inverter 122-2 becomes HIGH. This condition is latched by the latch comprising the NAND circuit 123-2 and the inverter 122-2. As a result, the output TC2 is changed from HIGH to LOW, while the output TC3 is turned from LOW to HIGH. In this condition, therefore, only the output TC3 is HIGH.

As described above, HIGH pulses are supplied in turn to the signal lines A and B to shift a position to the right one by one when this position marks the only one HIGH output among the outputs TC1 through TC8.

When there is a need to decrease the delay amount, HIGH pulses of the signals ΦRE and ΦRO are supplied to signal lines C and D in turn. Operations in this case are simply a reverse of the above-described operations, and a description thereof will be omitted. The output signals TC1 through TC8 generated in this manner are supplied to the variable-delay circuits (including the dummy-variable-delay circuit) so as to adjust a delay of a signal by one stage of delay elements at a time where this signal is subjected to a phase adjustment.

In what follows, a description will be given with reference to FIGS. 8 and 9 with regard to a case where the shift-step-switch signal A is HIGH, i.e., where the multi-shift scheme is engaged.

When the shift-step-switch signal A is HIGH, the NMOS transistors 128-1 through 128-8 and the NMOS transistors 129-1 through 129-8 shown in FIG. 8 are all turned off, so that HIGH pulses supplied to the signal lines A through D do not affect circuit operations. Also, the NMOS transistors 130-1 through 130-8 and the NMOS transistors 131-1 through 131-8 shown in FIG. 9 are all turned on, so that the signals N1 through N16 will be a critical factor to determine the control signals TC1 through TC8 of FIG. 8.

In the same manner as was previously described, when the reset signal R is set to LOW, the delay-control circuit 15 will be reset. In an initial condition immediately following the reset operation, the output TC1 of the NOR circuit 121-1 is HIGH, while the outputs TC2 through TCB of the NOR circuits 121-2 through 121-8, respectively, are LOW. That is, only the output TC1 is HIGH among the outputs TC1 through TC8.

When there is a need to increase a delay with respect to a signal subjected to phase adjustment, HIGH pulses are supplied to signal lines E and F in turn. With a HIGH pulse of the signal ΦSE supplied to the signal line E, the NMOS transistor 132-1 is turned on. Since the NMOS transistor 134-1 is in a turned-on state, the signals N1 and N3 are connected to the ground, so that outputs of the NAND circuits 123-1 and 123-2 are connected to the ground and forced to change from HIGH to LOW. Further, the outputs of the inverters 122-1 and 122-2 are changed to HIGH. As a result, the output TC1 is changed from HIGH to LOW, and the output TC3 is changed from LOW to HIGH. In this condition, therefore, only the output TC3 is HIGH.

With a HIGH pulse of the signal ΦSO supplied to the signal line F, the NMOS transistor 132-2 is turned on. Since the NMOS transistor 134-2 is already in a turned-on state, the signals N5 and N7 are connected to the ground, so that the outputs of the NAND circuits 123-3 and 123-4 are connected to the ground and forced to change from HIGH to LOW. Further, the outputs of the inverters 122-3 and 122-4 are changed to HIGH. As a result, the output TC3 is changed from HIGH to LOW, and the output TC5 is changed from LOW to HIGH. In this condition, therefore, only the output TC5 is HIGH.

In this manner, HIGH pulses are supplied in turn to the signal lines E and F to shift a position to the right two steps at a time where this position marks the only one HIGH output among the outputs TC1 through TC8.

When there is a need to decrease the delay amount by two stages at a time, HIGH pulses of the signals ΦRE and ΦRO are supplied to signal lines G and H in turn. Operations in this case are simply a reverse of the above-described operations, and a description thereof will be omitted. The output signals TC1 through TC8 generated in this manner are supplied to the variable-delay circuits (including the dummy-variable-delay circuit) so as to adjust a delay of a signal by two stages of delay elements at a time when this signal is subjected to a phase adjustment.

As described above, the delay-control circuit 15 shown in FIGS. 8 and 9 controls a position of the only one HIGH signal among the control signals TC1 through TC8 such that the position is shifted to the right or to the left by one stage at a time under the single-shift scheme and by two stages at a time under the multi-shift scheme.

Figure 10:
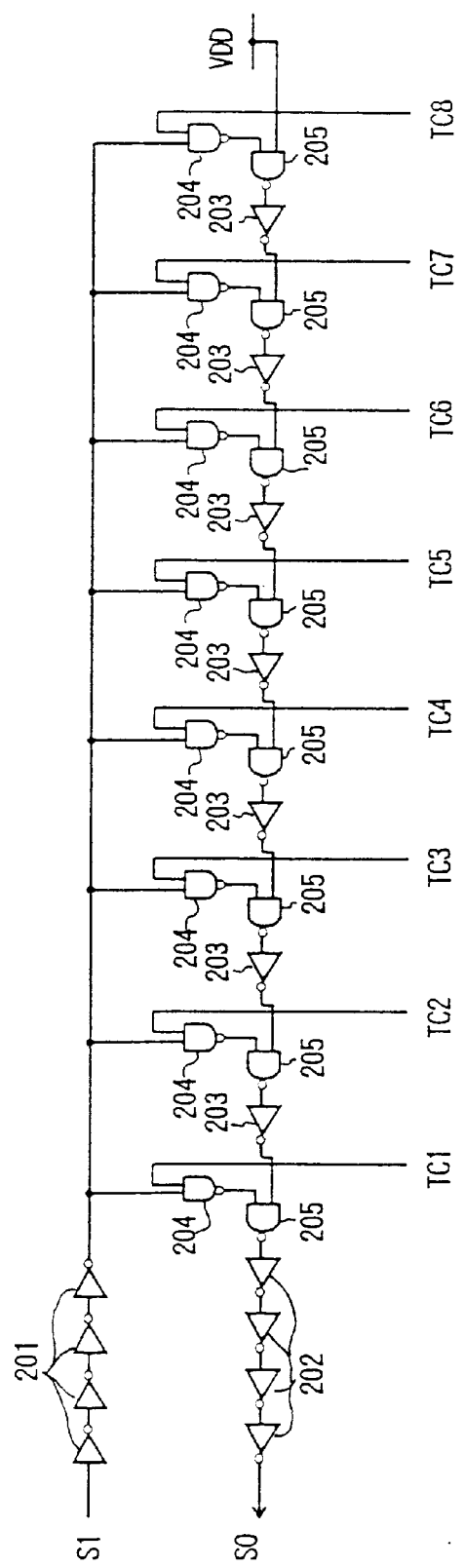
FIG. 10 is a circuit diagram showing a circuit structure of a variable-delay circuit.

FIG. 10 is a circuit diagram showing a circuit structure of a variable-delay circuit. The variable-delay circuit 12 and the dummy-variable-delay circuit 16 have an identical circuit configuration shown in FIG. 10. What is shown in FIG. 10 is a configuration comprised of eight stages of delay elements. In practice, the configuration may be comprised of 256 stages, for example.

The variable-delay circuit of FIG. 10 includes a plurality of inverters 201, a plurality of inverters 202, a plurality of inverters 203, a plurality of NAND circuits 204, and a plurality of NAND circuits 205. A given one of the inverters 203 and a corresponding one of the NAND circuits 205 together form one stage of a delay element, such that the plurality of inverters 203 and the plurality of NAND circuits 205 together form a series of delay elements having a plurality of delay stages. Control signals TC1 through TC8 are supplied to the NAND circuits 204, and only one of these signals is HIGH with remaining signals being LOW.

An input signal S1 is supplied to the plurality of NAND circuits 204 via the plurality of inverters 201. The input signal S1 passes through a given one of the NAND circuits 204 when this NAND circuit 204 receives a HIGH signal as one of the control signals TC1 through TC8, and enters the series of delay elements comprised of the plurality of inverters 203 and the plurality of NAND circuits 205. The input signal S1 propagates through the series of delay elements, and is output as an output signal SO after passing through the plurality of inverters 202. Depending on a position of the only one HIGH signal among the control signals TC1 through TC8, the input signal S1 passes through a different number of delay stages. Control of this position makes it possible to adjust how much the input signal S1 is delayed.

Where the single-shift scheme is employed, the only one HIGH signal among the control signals TC1 through TC8 changes a position thereof by one stage at a time. The delay amount is thus adjusted by a unit of one stage of delay elements. Under the multi-shift scheme, a position of the only one HIGH signal among the control signals TC1 through TC8 is shifted by two stages at a time. The delay amount is thus adjusted by a unit of two stages of delay elements.

In the embodiment described above, the multi-shift scheme performs a delay adjustment by a unit of two stages of delay elements. It should be noted, however, that the amount of delay shift at a time may be set to more than two stages of delay elements. If the delay should be shifted by three stages at a time, the circuit configuration of FIG. 9 may be slightly changed such that the signals N3 and N5 are connected to the ground at the same time as when the signal N1 is connected to the ground. If the delay needs to be changed by a unit of four stages, the circuit configuration is such that the signals N3, N5, and N7 are connected to the ground concurrently with the signal N1 when the signal N1 is connected to the ground.

In the following, further embodiments of the present invention will be described. In order to clarify underlying problems which the present invention seeks to overcome, a description of these problems will be presented first.

The present invention relates to a semiconductor device equipped with a clock-phase-adjustment circuit such as a DLL (delay locked loop) circuit, which adjusts a phase of an externally provided clock signal to generate an internal clock signal having a predetermined phase delay. In detail, the present invention relates to a semiconductor device equipped with a function to receive and output data accurately at a predetermined phase timing relative to an external clock signal despite presence of variations in circuit characteristics, ambient temperature, a power voltage, etc. For this purpose, an internal clock signal which is delayed by a predetermined number of clock cycles such as one clock cycle relative to the external clock signal is generated, and is used for synchronizing data when inputting the data to a device such as a dynamic random access memory.

In general, semiconductor integrated circuits (e.g., LSI) receive data as input signals from an exterior thereof, and performs proper processing in response to the received data so as to output a desired set of data. General-purpose LSIs typically require a data-output timing as an important factor to be considered in relation to the timing of input data in view of a need to achieve stable data output regardless of variations in circuit characteristics, ambient temperature, a power voltage, etc. To this end, it is necessary to define such a data output timing as part of specifications. In DRAMs, for example, specifications define a maximum frequency of address signals, a timing of data output relative to an edge timing of the address signals, a data-set-up time required for storing data, and so on.

In recent years, there has been a significant increase in speed of clock signals used for CPUs (central processing units) in computer systems as well as processing speed of other types of electrical circuits. Such an increase requires main memory units and interface units to operate at a faster speed than previously required. CPUs currently available in market include those operating on a clock signal faster than 100 MHz. General-purpose DRAMs, which are widely used as main memory units, need to operate at such an access/data-transfer speed as may surpass the CPU clock signal by an order. In response, various new types of DRAMs such as a synchronous DRAM (SDRAM) have been developed with an aim of achieving a data-transfer speed exceeding a 100-MHz-clock speed.

High-operation-speed DRAMs such as SDRAMs require data to be input/output at accurate phase timings relative to an externally provided clock signal having a high frequency. To this end, a clock-phase-adjustment circuit such as a DLL circuit is typically provided in DRAMs in an attempt to obtain an internal clock signal from an external clock signal by adjusting a phase of the external clock signal. With such a clock-phase-adjustment circuit provided, the internal clock signal generated by this circuit and data input to the DRAM are synchronized with each other.

Figure 11:
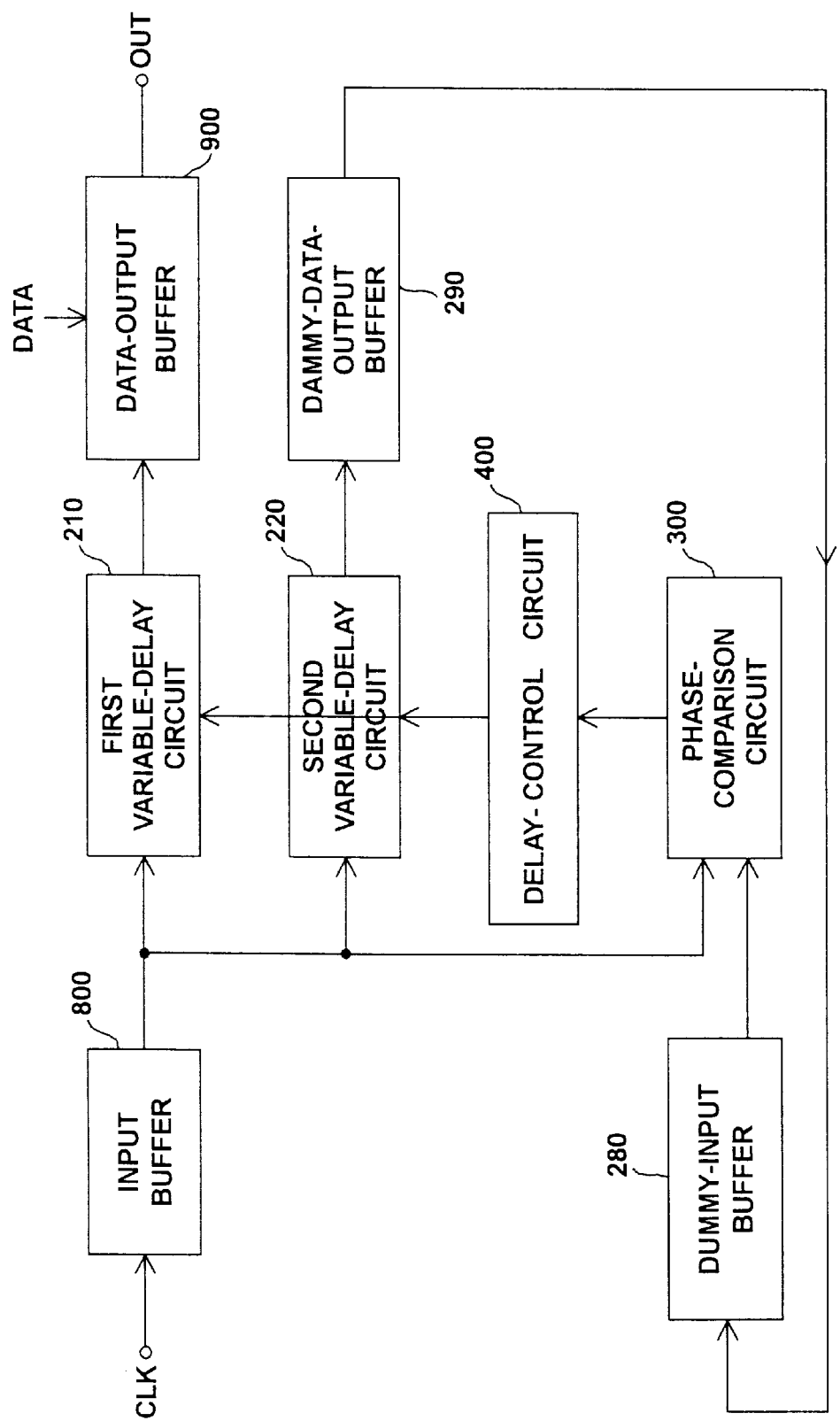
FIG. 11 is a block diagram showing a configuration of a semiconductor device which is equipped with a related-art clock-phase-adjustment circuit.

FIG. 11 is a block diagram showing a configuration of a semiconductor device which is equipped with a related-art clock-phase-adjustment circuit having such functions as presented above.

The related-art phase-adjustment circuit shown in FIG. 11 includes a first variable-delay circuit 210 and a second variable-delay circuit 220 which generate respective internal clock signals having a predetermined phase delay relative to an external clock signal CLK by introducing an appropriate delay to the external clock signal CLK when it is input via an input buffer 800. The phase-adjustment circuit further includes a phase-comparison circuit 300 which compares phases between the external clock signal CLK and a signal supplied thereto from the second variable-delay circuit 220 via a dummy-data-output buffer 290 and a dummy-input buffer 280. The phase-adjustment circuit further includes a delay-control circuit 400 which determines a delay amount of the first variable-delay circuit 210 and the second variable-delay circuit 220 based on the phase comparison made by the phase-comparison circuit 300.

In detail, the external clock signal CLK is amplified to a predetermined voltage level by the input buffer 800, and, then, is supplied to the first variable-delay circuit 210 and the second variable-delay circuit 220. Further, the external clock signal CLK from the input buffer 800 is supplied to the phase-comparison circuit 300 as a first input signal.

In order to cancel a phase delay of the external clock signal CLK introduced by the input buffer 800 on the input side of the phase-comparison circuit 300, the dummy-input buffer 280 is provided. Also, the dummy-data-output buffer 290 is provided in order to cancel a phase delay of the internal clock signal as such a phase delay is introduced by the data-output buffer 900 when outputting data DATA in synchronism with the internal clock signal generated by the first variable-delay circuit 210. The external clock signal CLK input to the second variable-delay circuit 220 is thus supplied to the phase-comparison circuit 300 as a second input signal via the dummy-data-output buffer 290 and the dummy-input buffer 280.

The phase-comparison circuit 300 compares the first input signal with the second input signal in terms of their phases, and supplies results of the phase comparison to the delay-control circuit 400. The delay-control circuit 400 controls the delay amount of the first variable-delay circuit 210 and the second variable-delay circuit 220 such that a phase difference between the external clock signal CLK and the internal clock signal becomes equivalent to a predetermined number of clock cycle such as one clock cycle (i.e., 360°). As a result, the external clock signal CLK input to the first variable-delay circuit 210 is supplied to the data-output buffer 900 as a signal having a delay thereof adjusted by the delay-control circuit 400. The data-output buffer 900 takes in data DATA in synchronism with the internal clock signal supplied from the first variable-delay circuit 210, and supplies the data DATA as an output signal OUT to an exterior of the device.

In the semiconductor devices having the related-art clock-phase-adjustment circuit, the delay amount of the first variable-delay circuit 210 and the second variable-delay circuit 220 is changed by one step at a time until a phase difference between the external clock signal and the internal clock signal becomes equivalent to a predetermined number of clock cycles such as 360° (i.e., until a lock-on status is accomplished). This is how the external clock signal is adjusted in terms of a phase thereof in the related art. When the DRAM or the like is operating in a normal-operation mode, i.e., when the DRAM or the like is in an active state, only a small fluctuation is observed with respect to the clock cycle of the external clock signal when such a fluctuation is caused by variations in circuit characteristics, a power voltage, and/or an ambient temperature. In the following cases, however, a lengthy time period is required before the delay amount is set to an appropriate delay to achieve a lock-on status. This gives rise to a problem that a longer time period is necessary before starting main operations such as data-read/write operations.

(1) At Time of Start of Power Supply

At a time of a start of power supply, the delay amount of the variable-delay circuits is reset to an initial state thereof, and, then, a phase adjustment is performed with respect to the external clock signal. Because of this, a lengthy time period is necessary before the variable-delay circuits achieve the lock-on status.

(2) At Time of Operation-Mode Switch (e.g., Return from Standby Mode)

When a DRAM of the like is in a standby mode, a clock frequency of the external clock signal and/or a power voltage are being lowered for the purpose of power saving. Because of this, the delay amount of the variable-delay circuits in the standby mode is far different from that used in an active state. In such a case, it takes a lengthy time before the variable-delay circuits achieves a lock-on state following a return from the standby mode.

Accordingly, there is a need for a semiconductor device which can shorten a time period required for achieving a lock-on status by adjusting a delay amount of variable-delay circuits or the like when a DRAM or the like has not been in the normal-operation mode as when power is just switched on or a return is just made from a standby mode.

Figure 12:
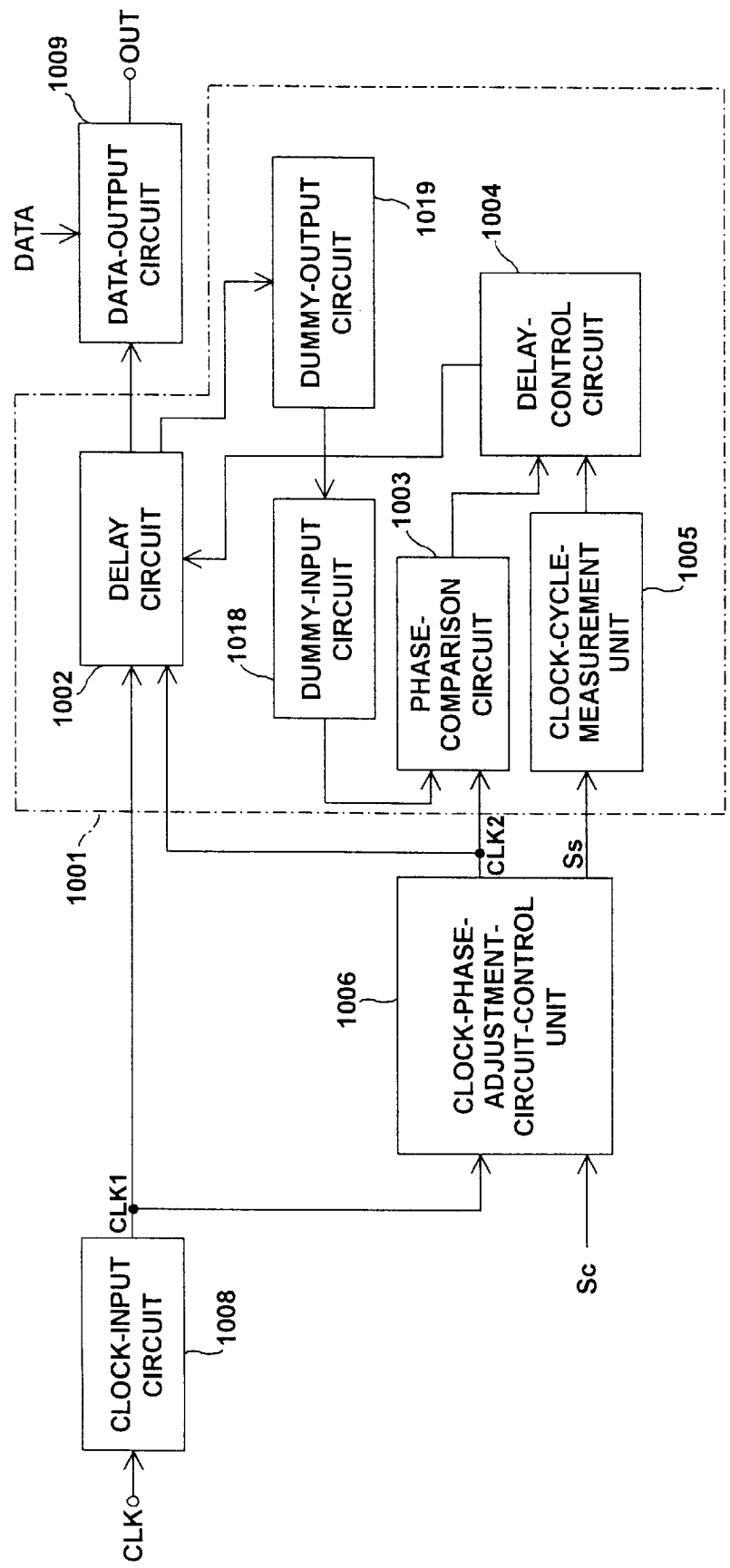
FIG. 12 is a block diagram showing a configuration according to a principle of the present invention.

FIG. 12 is a block diagram showing a configuration according to a principle of the present invention. In the figure, a configuration of a semiconductor device equipped with a phase-adjustment circuit is shown in a simplified form.

In order to obviate the problems described above, the semiconductor device of the present invention shown in FIG. 12 includes a clock-phase-adjustment circuit 1001 which adjusts a phase of an externally provided clock signal CLK so as to generate an internal clock signal.

The clock-phase-adjustment circuit 1001 includes a delay circuit 1002 which controls a delay of the external clock signal CLK (more precisely, a delay of a first clock input signal CLK1 in view of the presence of a clock-input circuit 1008), and outputs the internal clock signal obtained by delaying the external clock signal CLK. The clock-phase-adjustment circuit 1001 further includes a phase-comparison circuit 1003 which compares the external clock signal CLK with a signal responsive to the internal clock signal in terms of their phases. The clock-phase-adjustment circuit 1001 further includes a delay-control circuit 1004 which controls the delay of the delay circuit 1002 based on the phase comparison of the phase-comparison circuit 1003. The clock-phase-adjustment circuit 1001 further includes a clock-cycle-measurement unit 1005 which measures a delay amount equivalent to a predetermined number of cycles of the external clock signal CLK, and supplies a result of the measurement to the delay-control circuit 1004.

The delay-control circuit 1004 sets the delay amount equivalent to the predetermined number of cycles of the external clock signal CLK in the delay circuit 1002 during a period when the external clock signal CLK is not supplied to the phase-comparison circuit 1003.

Preferably, the semiconductor device of the present invention suspends supply of the external clock signal CLK to the phase-comparison circuit 1003 during a predetermined time period starting from the power on of the semiconductor device, so that a result of the measurement of the delay amount equivalent to the predetermined number of clock cycles of the external clock signal CLK can be supplied to the delay-control circuit 1004. This suspension is made by a clock-phase-adjustment-circuit-control unit 1006.

Further, the semiconductor device of the present invention preferably suspends supply of the external clock signal CLK to the phase-comparison circuit 1003 during a predetermined time period after switching of an operation mode of the semiconductor device, so that a result of the measurement of the delay amount equivalent to the predetermined number of clock cycles of the external clock signal CLK can be supplied to the delay-control circuit 1004. This suspension is made by the clock-phase-adjustment-circuit-control unit 1006.

In detail, the input side of the clock-phase-adjustment circuit 1001 is provided with the clock-input circuit 1008, which performs an almost identical function to that of the input buffer 800 (FIG. 11). Further, the output side of the clock-phase-adjustment circuit 1001 is provided with a data-output circuit 1009, which performs an almost identical function to that of the data-output buffer 900 (FIG. 11). During when the external clock signal CLK is supplied to the phase-comparison circuit 1003, the clock-input circuit 1008 amplifies the external clock signal CLK up to a predetermined level, and outputs the first clock-input signal CLK1. The first clock-input signal CLK1 is supplied to the delay circuit 1002 of the clock-phase-adjustment circuit 1001, and, also, is supplied to the phase-comparison circuit 1003 as a first input signal thereto (as a second clock-input signal CLK2) via the clock-phase-adjustment-circuit-control unit 1006.

In order to cancel a phase delay of the external clock signal CLK introduced by the clock-input circuit 1008 on the input side of the phase-comparison circuit 1003, the dummy-input circuit 1018 is provided. Also, the dummy-output circuit 1019 is provided in order to cancel a phase delay of the internal clock signal as such a phase delay is introduced by the data-output circuit 1009. The external clock signal CLK input to the delay circuit 1002 is thus supplied to the phase-comparison circuit 1003 as a second input signal thereto via the dummy-output circuit 1019 and the dummy-input circuit 1018. The phase-comparison circuit 1003 compares phases between the two input signals thereto, and supplies a result of the phase comparison to the delay-control circuit 1004.

Preferably, the semiconductor device of the present invention initially attends to a phase adjustment of the external clock signal CLK based on the measurement of the delay amount obtained by the clock-cycle-measurement unit 1005 immediately after power is switched on, and, then, makes a phase adjustment of the external clock signal CLK based on the phase comparison made by the phase-comparison circuit 1003.

Further, the semiconductor device of the present invention preferably attends to a phase adjustment of the external clock signal CLK based on the measurement of the delay amount obtained by the clock-cycle-measurement unit 1005 immediately after a return from the standby mode, and, then, makes a phase adjustment of the external clock signal CLK based on the phase comparison made by the phase-comparison circuit 1003.

In summary, the semiconductor device of the present invention is provided with the clock-cycle-measurement unit 1005 and the clock-phase-adjustment-circuit-control unit 1006 in addition to a conventional configuration. The clock-phase-adjustment-circuit-control unit 1006 suspends supply of the external clock signal CLK to the delay circuit 1002 and to the phase-comparison circuit 1003 during a predetermined period after the power on of the semiconductor device or after switching of an operation mode of the semiconductor device such as a return from the standby mode. During this period, the clock-phase-adjustment-circuit-control unit 1006 supplies a clock-cycle-measurement-control signal Ss to the clock-cycle-measurement unit 1005 in synchronism with the external clock signal CLK. The clock-cycle-measurement-control signal Ss includes a start signal START indicating a start of measurement of a delay amount equivalent to a predetermined number of clock cycles of the external clock signal CLK, a stop signal STOP indicating a completion of the measurement of the delay amount, and a gate signal GATE used for supplying the result of the measurement to the delay-control circuit 1004. A timing of the power on of the semiconductor device and a timing of switching of an operation mode of the semiconductor device are reported to the clock-phase-adjustment-circuit-control unit 1006 (DLL-control circuit) by means of a control signal Sc.

The clock-cycle-measurement unit 1005 measures a delay amount equivalent to a predetermined number of cycles of the external clock signal CLK, e.g., one clock cycle, and supplies the result of the measurement to the delay-control circuit 1004 only during a predetermined time period from the power on of the semiconductor device or from the switching of an operation mode of the semiconductor device. This operation is performed in response to the clock-cycle-measurement-control signal Ss. The delay-control circuit 1004 then sets a delay amount equivalent to one clock cycle of the external clock signal CLK in the delay circuit 1002. Through such operations of the clock-cycle-measurement unit 1005 and the clock-phase-adjustment-circuit-control unit 1006, a delay amount of a delay circuit unit is brought sufficiently close to a delay amount that would be necessary for achieving a lock-on state immediately after the power on or after the switching of an operation mode.

In this manner, the present invention significantly shortens a time period that variable-delay circuits or the like need in order to accomplish a lock-on status when a DRAM or the like has not been in an active state as when power is just turned on or when a return is just made from the standby mode.

In the following, further embodiments of the present invention will be described with reference to the accompanying drawings.

For the purpose of facilitating understanding of features and configurations of the embodiments, an SDRAM to which the present invention is applied will be first used as an example, and operations and a configuration thereof will be described.

Figure 13:
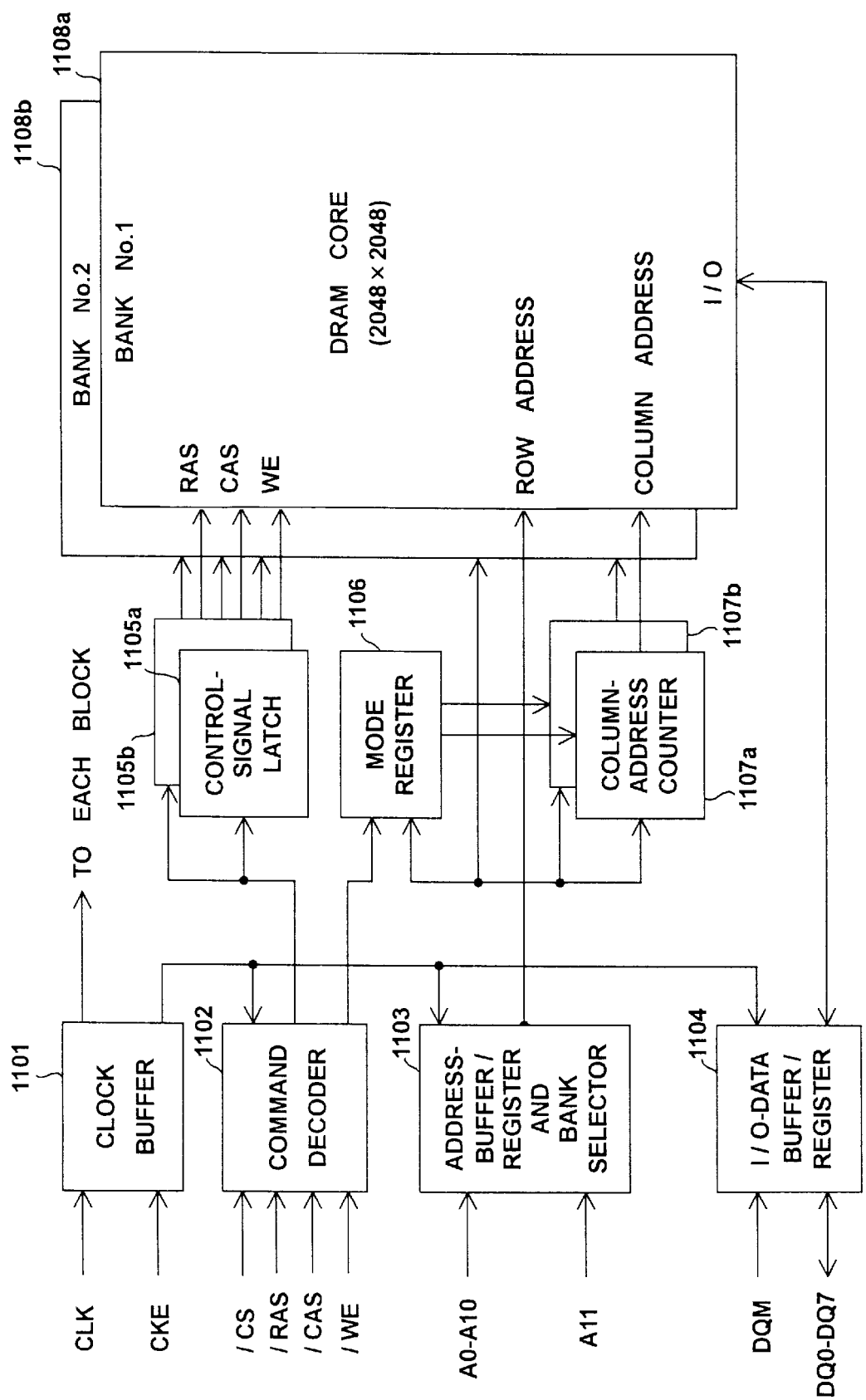
FIG. 13 is a block diagram showing a schematic configuration of a synchronous DRAM to which the present invention is applied.
Figure 14:
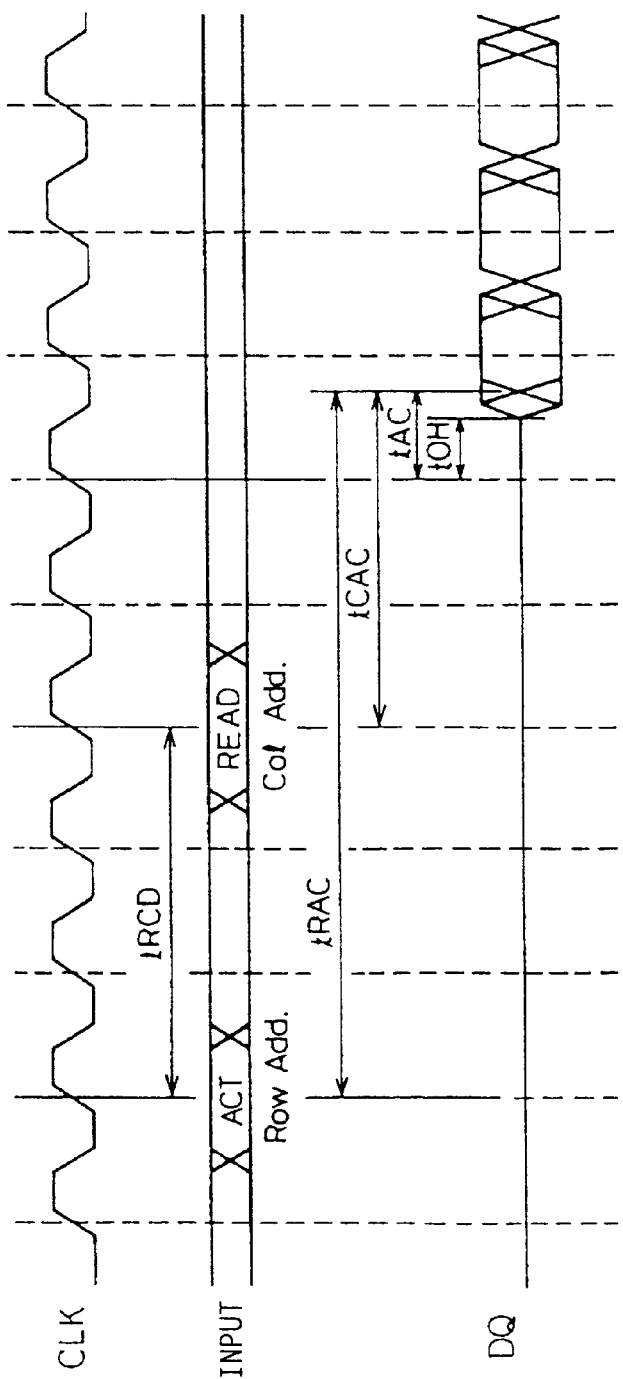
FIGS. 14A through 14C are timing charts for explaining operations of the synchronous DRAM of FIG. 13.

FIG. 13 is a block diagram showing a schematic configuration of a synchronous DRAM to which the present invention is applied. FIGS. 14A through 14C are timing charts for explaining operations of the synchronous DRAM of FIG. 13.

A semiconductor chip comprised of the synchronous DRAM of FIG. 13 includes a clock buffer 1101, a command decoder 1102, an address-buffer/register and bank selector 1103, a I/O-data buffer/register 1104, control-signal latches 1105a and 1105b, a mode register 1106, column-address counters 1107a and 1107b, and DRAM cores 1108a and 1108b.

The DRAM cores 1108a and 1108b have a 2048-bit-by-2048-bit configuration, and comprise a plurality of banks (e.g., bank No.0 and bank No.1), each of which constitutes a memory area inside the chip. The control-signal latches 1105a and 1105b store various control signals such as a row-address-control signal RAS, a column-address-control signal CAS, and a write-enable signal WE with respect to the DRAM cores 1108a and 1108b, respectively. The mode register 1106 is used for specifying an operation mode of the SDRAM. The column-address counters 1107a and 1107b are used for accessing data by counting column addresses.

The clock buffer 1101 holds a clock signal (i.e., external clock signal) CLK in response to a clock-enable signal CKE, and supplies same to other circuits. The clock signal CLK serves as a reference for controlling the operations of the synchronous DRAM. The command decoder 1102 decodes various command signals such as a chip-select signal /CS, a row-address-strobe signal /RAS, a column-address-strobe signal /CAS, and a write-enable signal /WE, and supplies decoded results to the control-signal latches 1105a and 1105b as well as to the mode register 1106. The address-buffer/register and bank selector 1103 holds memory-address signals A0 through A10 inclusive of a row address and a column address and a bank-address signal A11, and supplies these to the mode register 1106, the column-address counters 1107a and 1107b, and the DRAM cores 1108a and 1108b. The I/O-data buffer/register 1104 holds data DQ (DQ0 through DQ7 and DQM), and supplies it to an I/O portion of the DRAM cores.

In FIG. 13, the command signals such as the chip-select signal /CS, the row-address-strobe signal /RAS, the column-address-strobe signal /CAS, and the write-enable signal /WE are used for determining an operation mode. Different combinations of signal levels of the command signals specify different commands. These commands are decoded by the command decoder 1102, and are used for controlling various circuits in accordance with the specified operation mode. Further, the chip-select signal /CS, the row-address-strobe signal /RAS, the column-address-strobe signal /CAS, and the write-enable signal /WE are supplied to the control-signal latches 1105a and 1105b, where a current status of the command signals is latched and maintained until a next command is input.

Further, the memory-address signals A0 through A10 and the bank-address signal A11 are amplified by the address-buffer/register and bank selector 1103, and are used as a load address of each bank. In addition, these signals are used as an indication of an initial address by the column-address counter 1107a and 1107b. Signals read form the DRAM core 1108a and 1108b are amplified by the I/O-data buffer/register 1104, and are output in synchronism with rising edges of the external clock signal CLK. Similar operations are performed when data is input, such that data input to the I/O-data buffer/register 1104 is stored in the DRAM cores 1108a and 1108b.

In the timing chart shown in FIG. 14B, various control signals are input to the DRAM core in synchronism with rising edges of the external clock signal CLK shown in FIG. 14A, so that data stored in the DRAM core is read. First, a row address of a memory-core matrix is selected with respect to the DRAM core. Then, a predetermined time period later (row-address-access time tRCD), a column address is selected to commence a data-read operation.

In detail, when data is to be read from the SDRAM, an active command (ACT) is input to the command nodes by selecting a particular combination of the command signals as previously described, and a row address is also input to the address nodes. Upon input of the command and the row address, the SDRAM engages in an active state to select a word line indicated by the row address, and outputs cell data of the selected word line to bit lines. The data on the bit lines is amplified by sense amplifiers. Also, after a passage of a time period (row-address-access time tRCD) corresponding to operations of the above-described row-address access, a read command (READ) and a column address are input. In accordance with the column address, data of a selected sense amplifier is output to a data bus, and is amplified by a data-bus amplifier. The data is further amplified by an output buffer to be output as data DQ from the output nodes (FIG. 14C).

A series of the above-described operations are the same as those of conventional DRAMs. In the case of SDRAMs, however, circuits relevant to column access are designed to perform pipe-line operations, so that read data is consecutively output one cycle after another. Because of this, a cycle of the data transfer becomes equal to the cycle of the external clock signal CLK.

There are three types of access times with regard to an SDRAM. All of them are defined by using a rising edge of the external clock signal CLK as a reference. In FIGS. 14A through 14C, a row-address-access time TRAC indicates a time period during which operations regarding row-address access are performed, and a column-address-access time TCAC indicates a time period during which operations regarding column-address access are performed. Further, a clock-access time TAC indicates a delay of data output relative to a reference timing of the external clock signal CLK. When the SDRAM is used in a high-speed memory system, as much as tRAC and tCAC are important factors indicating respective time periods from command input to data output, the clock-access time tAC is a critical factor in enhancing a data-transfer speed.

In FIGS. 14A through 14C, further, an output-data-hold time tOH indicate a time period during which data is held with respect to a previous cycle or a next cycle. Because of variations, temperature dependency, and power-voltage dependency of circuit characteristics, tAC and tOH do not match, and tend to have a certain time gap therebetween. During this time gap, data output from the output nodes is not valid. This time period during which data is not valid, i.e., a data-invalid period, means that it is not certain as to what data is being output. That is, the memory system cannot use this time period for an operation thereof.

The data-invalid period tends to fluctuate due to variations in SDRAM characteristics, temperature, a power voltage, etc. Under such conditions, appropriate data output at a correct timing can be accomplished when data is output with a constant phase relation relative to the external clock signal CLK. That is, the clock-access time tAC needs to be constant. Where the output of data is in synchronism with a rising edge of the internal clock signal, for example, a phase difference between the internal clock signal and the external clock signal CLK needs to be equal to a predetermined number of clock cycles such as 360°. To achieve this, a delay of the delay circuit in the clock-phase-adjustment circuit (FIG. 12) is set accordingly.

Figure 15:
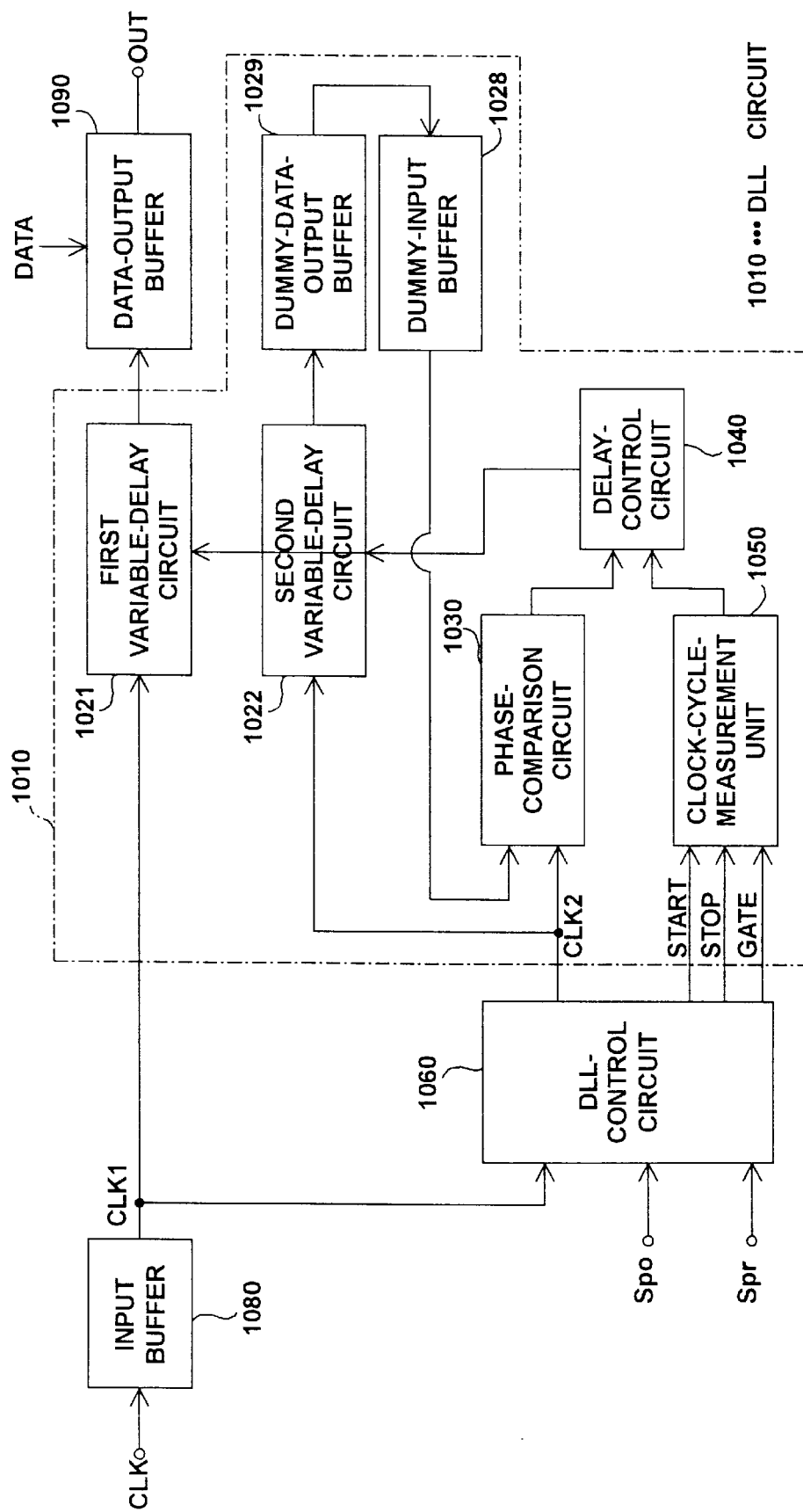
FIG. 15 is a block diagram showing a configuration of an embodiment according to the present invention.

FIG. 15 is a block diagram showing a configuration of an embodiment according to the present invention. Hereinafter, the same elements as those previously described are referred to by the same numerals, and a description thereof will be omitted.

In the embodiment shown in FIG. 15, a DLL circuit 1010 is provided to serve as the clock-phase-adjustment circuit 1001 of FIG. 12. The DLL circuit 1010 adjusts a delay (phase) of the external clock signal CLK to generate an internal clock signal having a delay equal to a predetermined number of clock cycles.

The DLL circuit 1010 includes a first variable-delay circuit 1021 and a second variable-delay circuit 1022 which generate respective internal clock signals having a predetermined phase delay relative to an external clock signal CLK (i.e., a first input-clock signal CLK1) by introducing an appropriate delay to the external clock signal CLK when it is input via an input buffer 1080. The first variable-delay circuit 1021 and the second variable-delay circuit 1022 correspond to the delay circuit 1002 of FIG. 12. The DLL circuit 1010 further includes a phase-comparison circuit 1030 which compares phases between the external clock signal CLK and a signal supplied thereto from the second variable-delay circuit 1022 via a dummy-data-output buffer 1029 and a dummy-input buffer 1028. The phase-comparison circuit 1030 corresponds to the phase-comparison circuit 1003 of FIG. 12.

The DLL circuit 1010 further includes a delay-control circuit 1040 which determines a delay amount of the first variable-delay circuit 210 and the second variable-delay circuit 220 based on the phase comparison made by the phase-comparison circuit 1030. Here, the delay-control circuit 1040 serves as the delay-control circuit 1004 of FIG. 12. The DLL circuit 1010 further includes a clock-cycle-measurement unit 1050 which measures a delay amount equivalent to a predetermined number of cycles of the external clock signal CLK, and supplies a result of the measurement to the delay-control circuit 1040 during when the supply of the external clock signal CLK (i.e., a second input-clock signal CLK2) to the phase-comparison circuit 1030 is suspended. The clock-cycle-measurement unit 1050 serves as the clock-cycle-measurement unit 1005 of FIG. 12.

In the embodiment of FIG. 15, further, a DLL-control circuit 1060 is provided so as to serve as the clock-phase-adjustment-circuit-control unit 1006 of FIG. 1. The DLL-control circuit 1060 suspends the supply of the second input-clock signal CLK to the phase-comparison circuit 1030 during a predetermined time period after a start of power supply to the semiconductor device or switching of an operation mode of the semiconductor device, thereby allowing the clock-cycle-measurement unit 1050 to supply a result of the measurement of the delay to the delay-control circuit 1040. The DLL-control circuit 1060 generates the second input-clock signal CLK2 based on the first input-clock signal CLK1 supplied from the input buffer 1080, and supplies the second input-clock signal CLK2 to the phase-comparison circuit 1030 as one input thereof. When a power-down-return signal Spr indicative of a return from the standby mode is supplied to the DLL-control circuit 1060, the supply of the second input-clock signal CLK2 to the phase-comparison circuit 1030 is suspended. During the suspension, the start signal START indicating a start of measurement of the delay, the stop signal STOP indicating an end of the measurement, and the gate signal GATE for sending the result of the measurement to the delay-control circuit 1040 are supplied to the clock-cycle-measurement unit 1050.

Further, the embodiment of FIG. 15 is provided with the input buffer 1080, which performs an almost identical function to that of the input buffer 800 (FIG. 11), and is provided with a data-output buffer 1090, which performs an almost identical function to that of the data-output buffer 900 (FIG. 11). In order to cancel a phase delay of the external clock signal CLK introduced by the input buffer 1080 on the input side of the phase-comparison circuit 1030, the dummy-input buffer 1028 is provided. Also, the dummy-data-output buffer 1029 is provided in order to cancel a phase delay of the internal clock signal as such a phase delay is introduced by the data-output buffer 1090.

The dummy-input buffer 1028 and the dummy-data-output buffer 1029 perform almost identical functions to those of the dummy-input buffer 280 and the dummy-data-output buffer 290 of the related art, respectively. The external clock signal CLK input to the second variable-delay circuit 1022 is thus supplied to the phase-comparison circuit 1030 as a second input signal thereto via dummy-input buffer 1028 and the dummy-data-output buffer 1029. The phase-comparison circuit 1030 compares phases between the two input signals thereto, and supplies a result of the phase comparison to the delay-control circuit 1040.

In FIG. 15, when the semiconductor device such as a DRAM is in a normal-operation mode, the DLL circuit 1010 of this embodiment operates in a similar manner to the related-art phase-adjustment circuit shown in FIG. 11. In such a normal-operation mode, the external clock signal CLK is amplified by the input buffer 1080, and is supplied to the first variable-delay circuit 1021 and the DLL-control circuit 1060 as the first input-clock signal CLK1.

The first input-clock signal CLK1 supplied to the DLL-control circuit 1060 is supplied to the second variable-delay circuit 1022, and, also, is provided to the phase-comparison circuit 1030 as one input thereto. This signal is shown as the second input-clock signal CLK2. The second input-clock signal CLK2 supplied to the second variable-delay circuit 1022 is supplied to the phase-comparison circuit 1030 as the other input thereto via the dummy-data-output buffer 1029 and the dummy-input buffer 1028. The phase-comparison circuit 1030 compares the two input signals in terms of their phases, and supplies results of the phase comparison to the delay-control circuit 1040.

The delay-control circuit 1040 controls the delay of the first variable-delay circuit 1021 and the second variable-delay circuit 1022 based on the results of the phase comparison supplied from the phase-comparison circuit 1030. As a result, the first input-clock signal CLK1 supplied to the first variable-delay circuit 1021 ends up having a delay thereof controlled by the delay-control circuit 1040, and, then, is supplied to the data-output buffer 1090. The data-output buffer 1090 takes in data DATA in synchronism with the internal clock signal, i.e., in synchronism with the first input-clock signal CLK1 having the delay thereof controlled by the delay-control circuit 1040, and outputs the data to an exterior of the device as output signals OUT.

With reference to FIG. 15, operations immediately following a power-on of the semiconductor device or a return from the standby mode will be described.

Upon a start of power supply, a power-voltage-rise signal Spo is changed to a high-voltage level (HIGH), whereas a power-down-return signal Spr becomes HIGH upon a return from the standby mode. When either of the two events happens, as will be described later, the second input-clock signal CLK2 is changed to a low-voltage level (LOW) for a predetermined time period, so that no external clock signal is supplied to the second variable-delay circuit 1022 and the delay-control circuit 1040.

During when the supply of the external clock signal to the second variable-delay circuit 1022 and the delay-control circuit 1040 is suspended, the start signal START, the stop signal STOP, and the gate signal GATE are supplied to the clock-cycle-measurement unit 1050 in synchronism with the first input-clock signal CLK1. The clock-cycle-measurement unit 1050 measures a delay among equivalent to one clock cycle of the external clock signal by using the start signal START, the stop signal STOP, and the gate signal GATE, and outputs an obtained result to the delay-control circuit 1040. Based on the result of the measurement, the delay-control circuit 1040 determines the delay amount of the first variable-delay circuit 1021 and the second variable-delay circuit 1022, so that the delay amount is set close to a proper delay for achieving a lock-on status of the variable-delay circuits. After this, the external clock signal starts to be supplied to the second variable-delay circuit 1022 and to the phase-comparison circuit 1030. Operations of the DLL circuit thereafter are the same as those in the normal-operation mode.

In summary, this embodiment of the present invention is provided with a means (e.g., the clock-cycle-measurement unit 1050) for measuring a clock cycle of the external clock signal upon input of the first clock cycle thereof when the semiconductor device such as a DRAM is not in the normal-operation mode as may be the case immediately after the power on of the semiconductor device or a return from the standby mode. Use of such a means makes it possible to set the delay amount of the delay-circuit unit directly to a proper delay amount required for achieving a lock-on status of the first variable-delay circuits 1021 and 1022, thereby eliminating a need for changing the delay amount of the first variable-delay circuits 1021 and 1022 one stage by one stage. At a next clock cycle and thereafter, the external clock signal is supplied to the phase-comparison circuit 1030 so as to make a stage-wise adjustment with an aim of achieving a finer phase adjustment of the internal clock signal. This accomplishes a successful lock-on state of the variable-delay circuits.

Accordingly, the embodiment of the present invention can significantly reduce a time period necessary for bringing the variable-delay circuits to a lock-on status even when the semiconductor device such as a DRAM is not in a normal-operation mode.

Figure 16:
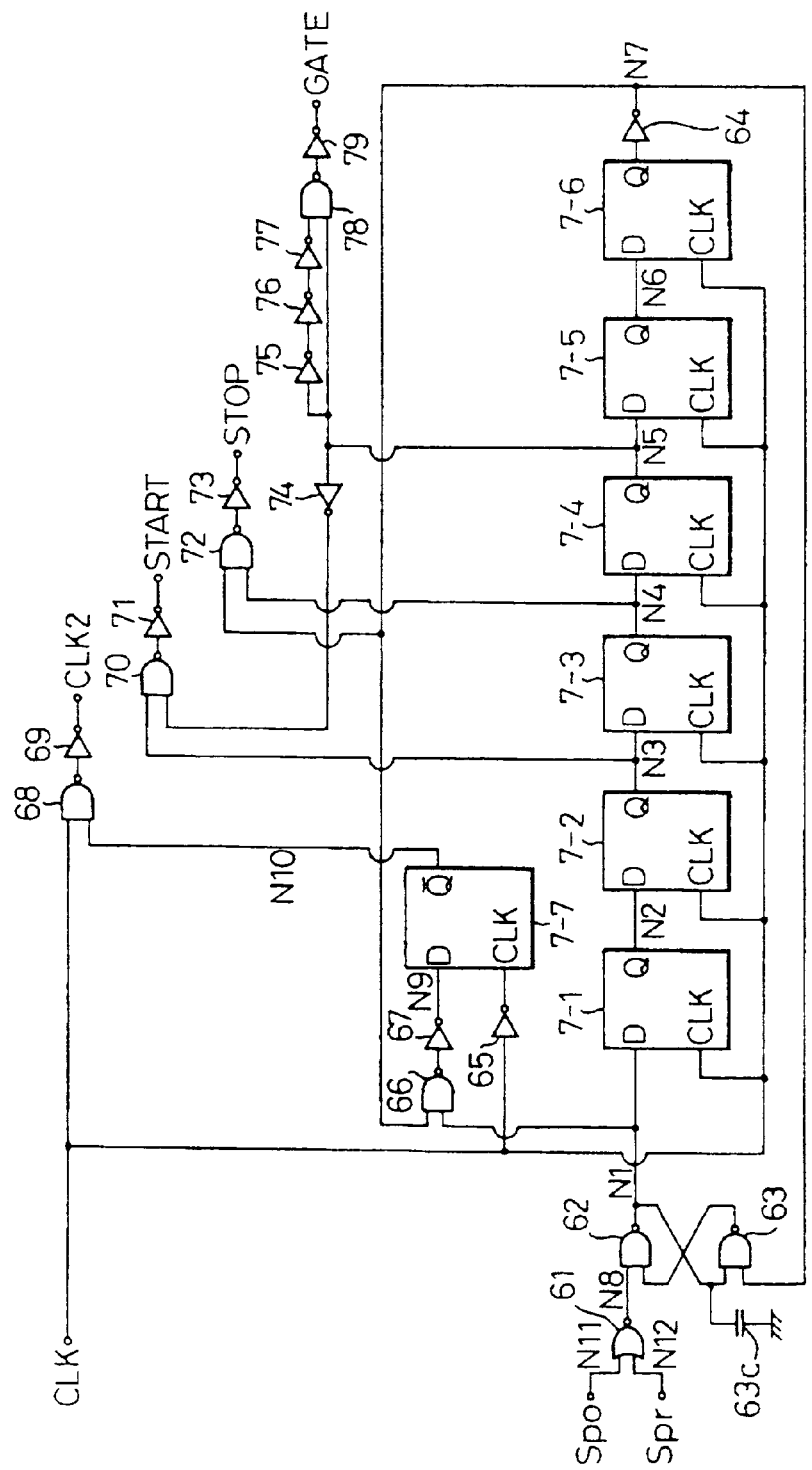
FIG. 16 is a circuit diagram showing a configuration of a DLL-control circuit shown in FIG. 15.
Figure 17:
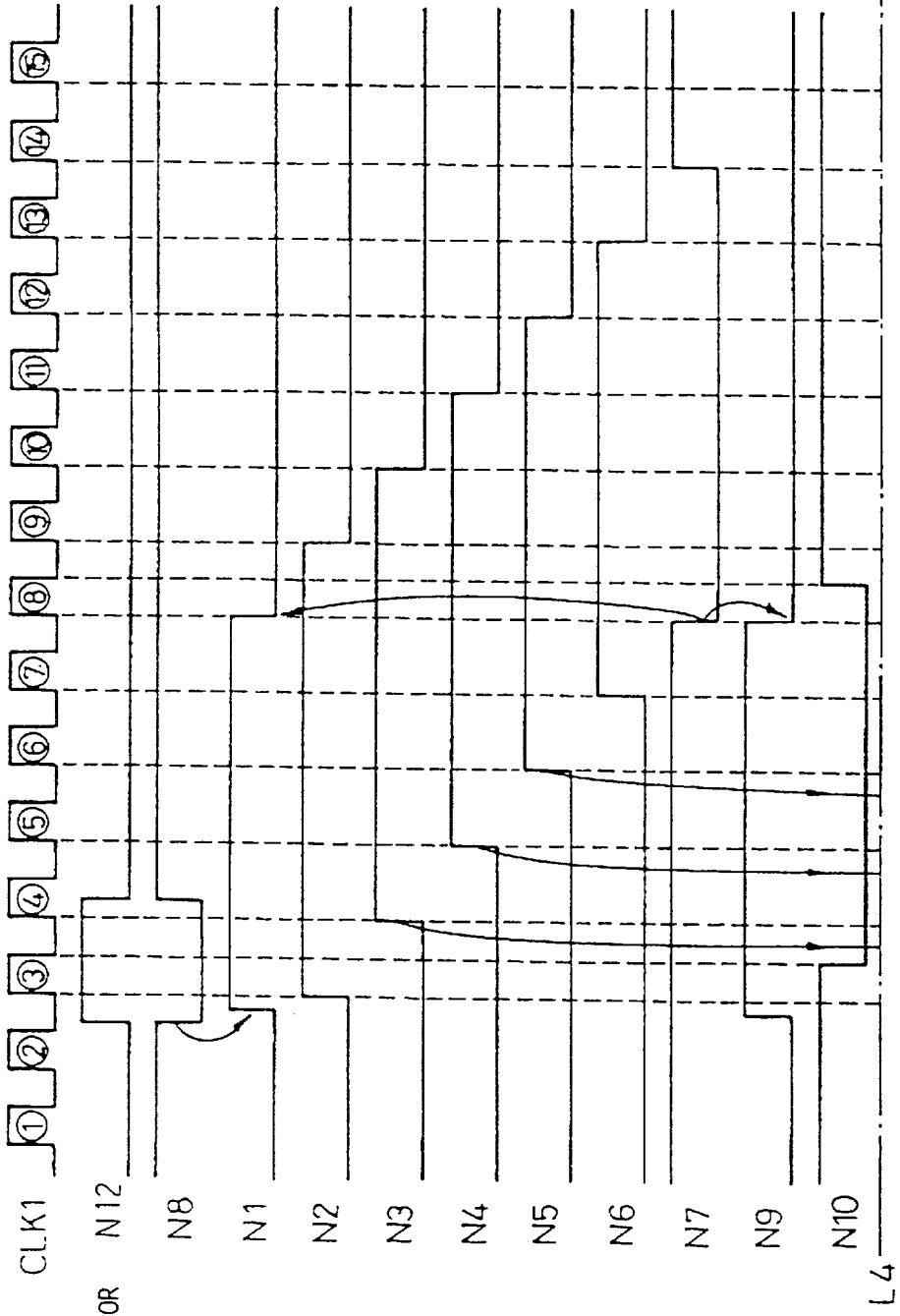
FIGS. 17A through 17M are timing charts for explaining operations of the DLL-control circuit shown in FIG. 16.

FIG. 16 is a circuit diagram showing a configuration of the DLL-control circuit shown in FIG. 15. FIGS. 17A through 17M are timing charts for explaining operations of the DLL-control circuit shown in FIG. 16. FIGS. 18A through 18E are further timing charts for explaining operations of the DLL-control circuit shown in FIG. 16.

As shown in FIG. 16, the DLL-control circuit 1060 according to the embodiment of the present invention includes a plurality (e.g., six) of D flip-flops shown as first to sixth D-flip-flops 1007-1 through 1007-6, which generate a start signal START, a stop signal STOP, and a gate signal GATE in response to a voltage-level change in the power-voltage-rise signal Spo or the power-down-return signal Spr. Here, the power-voltage-rise signal Spo indicates a start of power supply to the semiconductor device, and the power-down-return signal Spr indicates a return from the standby mode. The DLL-control circuit 1060 further includes a seventh D-flip-flop 1007-7, which determines whether the second input-clock signal CLK2 is supplied to the phase-comparison circuit 1030 based on a voltage-level change in the power-voltage-rise signal Spo or the power-down-return signal Spr.

In the timing charts of FIGS. 17A through 17M, the power-voltage-rise signal Spo (node N11) that is HIGH at the start of power supply is supplied to a node N8 via a NOR gate 1061. Alternately, the power-down-return signal Spr (node N12) that is HIGH at the return from the standby mode is supplied to the node N8 via the NOR gate 1061. When this happens, a RS-flip-flop comprised of two NAND circuits 1061 and 1062 has a HIGH-level signal at an output thereof (node N1). this HIGH-level signal is supplied to the first D-flip-flop 1007-1. In the case where power is turned on, the output (node N1) of the RS-flip-flop may not have a definite signal level during a time period from when the device is actually switched on to when the power-voltage-rise signal Spo is actually supplied.

In this embodiment, the node N1 is connected to the ground via a capacitor 1063c, thereby insuring that the node N1 holds a LOW level until the power-voltage-rise signal Spo (node N11) is supplied.

Figure 18:
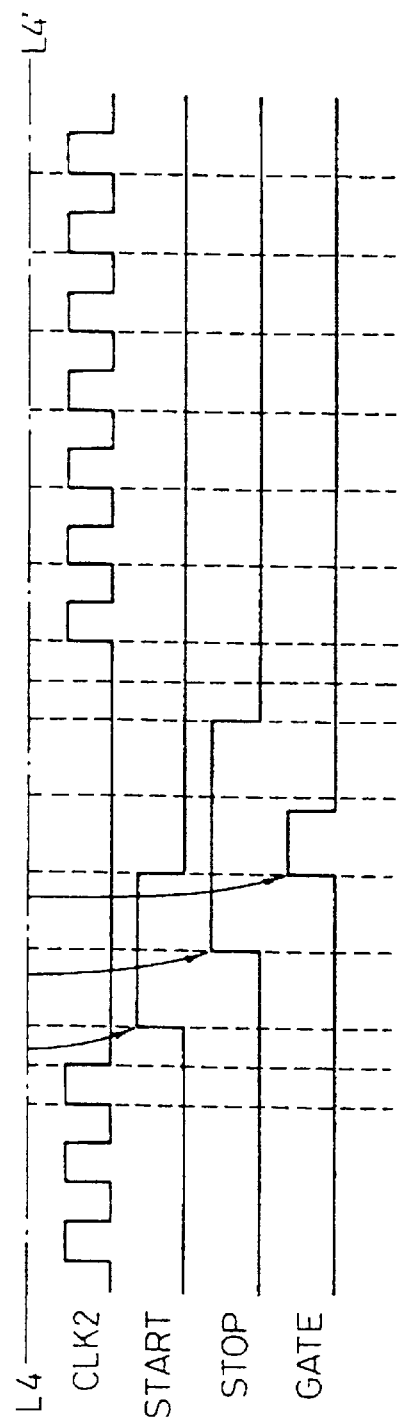
FIGS. 18A through 18E are further timing charts for explaining operations of the DLL-control circuit shown in FIG. 16.

The first D-flip-flop 1007-1 outputs a HIGH-level signal (node N2) to the second D-flip-flop 1007-2 in synchronism with the first clock input-signal CLK1, which corresponds to the external clock signal CLK. Likewise, the second to sixth D-flip-flops 1007-2 through 1007-6 connected in series along with the first D-flip-flop 1007-1 outputs a HIGH-level signal to a next following flip-flop in synchronism with the first input-clock signal CLK1, as indicated as node N3 through node N6. Signals (node N3 through node N5) output from the second to fourth D-flip-flops 1007-2 through 1007-4 are used for generating the start signal START, the stop signal STOP, and the gate signal GATE, which have a respective signal form as shown in FIGS. 18C through 18E, respectively. These signals are supplied to the clock-cycle-measurement unit 1050. The start signal START is output via a NAND gate 1070 and an inverter 1071, and the stop signal STOP is output via a NAND gate 1072 and an inverter 1073. Further, the gate signal GATE is output via inverters 1075 through 1077, a NAND gate 1078, and an inverter 1079.

The HIGH-level signal output from the sixth D-flip-flop 1007-6 is converted into a LOW-level signal by an inverter 1064, and, then, is supplied to a reset-input node of the RS flip-flop circuit described above. This LOW-level signal prompts the output (node N1) of the RS-flip-flop to change to LOW.

Signals appearing at the node N1 and node N7 are supplied to a set-input node (node N9) of the seventh D-flip-flop 1007-7 via a NAND gate 1066 and an inverter 1067. The seventh D-flip-flop 1007-7 operates in synchronism with an inverse of the first input-clock signal CLK1 supplied form an inverter 1065, and outputs a LOW-level signal at an inverse-output node (/Q) thereof. This LOW-level signal (node N10) and the first input-clock signal CLK1 are supplied to a NAND gate 1068 and an inverter 1069, and are converted into the second input-clock signal CLK2 (see FIG. 18B), which is supplied to the second variable-delay circuit 1022 and the phase-comparison circuit 1030. When the signals at the node N1 and the node N7 are HIGH, the output (node N10) of the seventh D-flip-flop 1007-7 becomes LOW, so that a LOW-level signal is supplied as the second input-clock signal CLK2. Namely, during a predetermined period from the start of power supply or a return from the standby mode, supply of the external clock signal is suspended with respect to the second variable-delay circuit 1022 and the phase-comparison circuit 1030.

Figure 19:
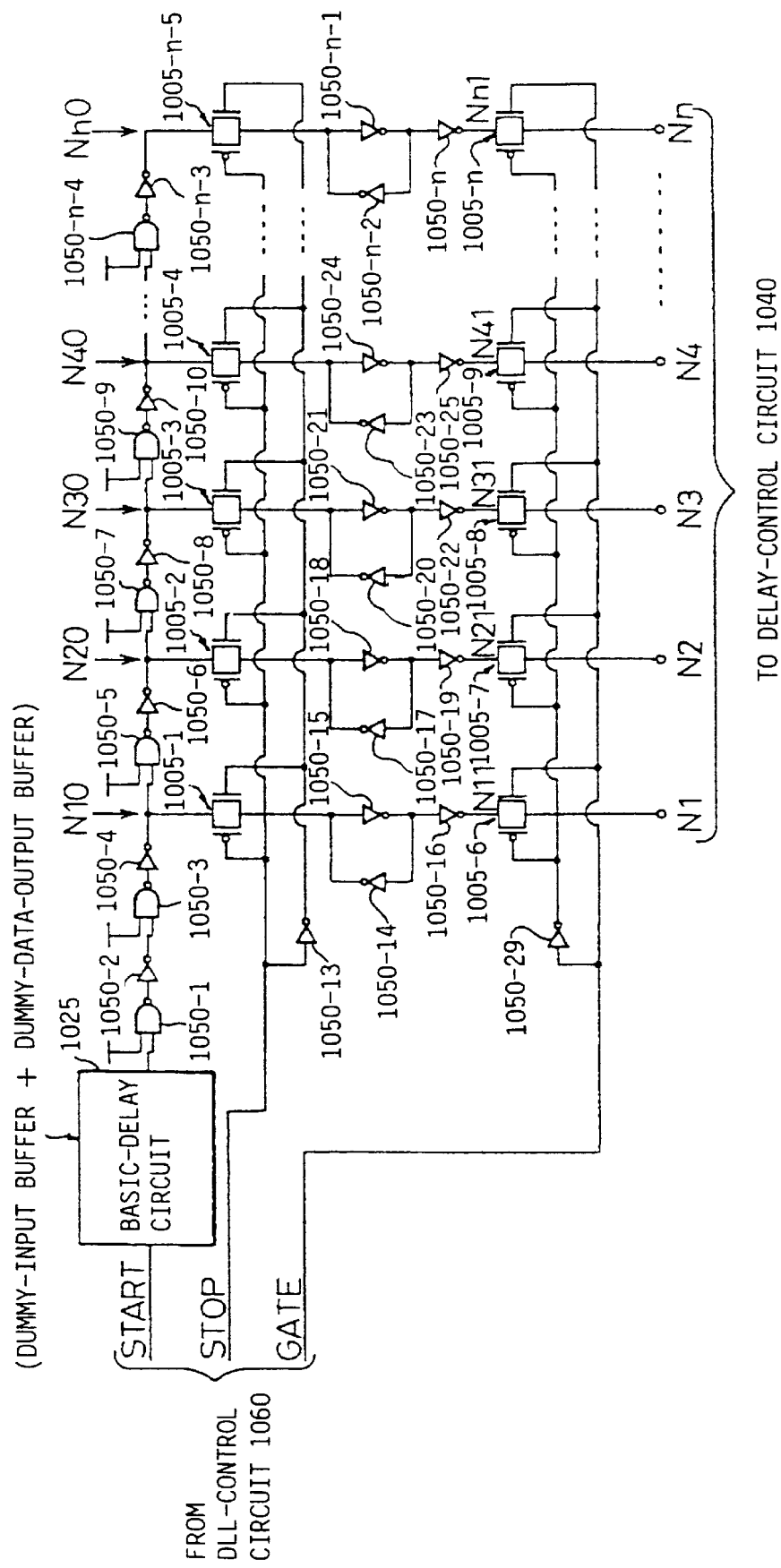
FIG. 19 is a circuit diagram showing a configuration of a clock-cycle-measurement unit shown in FIG. 15.

FIG. 19 is a circuit diagram showing a configuration of the clock-cycle-measurement unit shown in FIG. 15. FIGS. 20A through 20E are timing charts for explaining operations of the clock-cycle-measurement unit shown in FIG. 19. FIGS. 21A through 21F are further timing charts for explaining operations of the clock-cycle-measurement unit shown in FIG. 16.

As shown in FIG. 19, the clock-cycle-measurement unit 1050 of the embodiment of the present invention includes a basic-delay circuit 1025 which has a delay thereof equivalent to a sum of a delay of the dummy-input buffer and a delay of the dummy-data-output buffer. The clock-cycle-measurement unit 1050 further includes a plurality of stages of delay circuits and a plurality of transfer gates, which are used for counting a delay amount equivalent to one cycle of the external clock signal based on the start signal START and the stop signal STOP supplied form the DLL-control circuit 1060. The clock-cycle-measurement unit 1050 further includes latch circuits comprised of a plurality of diodes and transfer gates, which are used for holding the counted delay amount based on the gate signal GATE.

As shown in FIGS. 20A through 20D, the start signal START, the stop signal STOP, and the gate signal GATE, which are generated by the DLL-control circuit 1060, are supplied to the clock-cycle-measurement unit 1050 in synchronism with the first input-clock signal CLK1 during a predetermined time period starting from the power on of the semiconductor device or a return from the standby mode.

The start signal START, having passed through the basic-delay circuit 1025, propagates through a set of delay circuits amounting to a plurality of stages (n stages: n is an arbitrary positive integer), each of which is comprised of a NAND gate and an inverter. (That is, the start signal START propagates along nodes N10, N20, N30, N40, . . . , Nn0.) The delay amount of the basic-delay circuit 1025 is a sum of the delay of the dummy-input buffer 1028 shown in FIG. 15 and the delay of the dummy-data-output buffer 1029. The first stage of the delay circuits involves a total delay accounted for by two NAND gates 1050-1 and 1050-3 and two inverters 1050-2 and 1050-4. The second stage of the delay circuits involves a delay introduced by a NAND gate 1050-5 and an inverter 1050-6, and the third stage of the delay circuits involves a delay introduced by a NAND gate 1050-7 and an inverter 1050-8. Further, the fourth stage of the delay circuits involves a delay accounted for by a NAND gate 1050-9 and an inverter 1050-10. By the same token, the n-th stage of the delay circuits involves a delay introduced by a NAND circuit 1050-n-4 and an inverter 1050-n-3.

The delay amount of one stage of the delay circuits is equal to the delay amount of one stage of the first variable-delay circuit 1021 and the second variable-delay circuit 1022 shown in FIG. 15. A detailed circuit structure of these variable-delaycircutis will be described later. Signals appearing at nodes N10 through Nn0 are supplied via transfer gates 1005-1 through 1005-n-5, respectively connected to the nodes N10 through Nn0, to a plurality of latch circuits, which in turn latch these signals. Signals latched by the latch circuits appear at nodes N11, N21, N31, N41, . . . , Nn1.

The first stage of the latch circuits includes inverters 1050-14 and 1050-15 having an output of either one thereof connected to an input of the other one thereof, an inverter 1050-16 inverting a signal output from the inverter 1050-15, and a transfer gate 1005-6 connected to an output (node N11) of the inverter 1050-16. The second stage of the latch circuits includes inverters 1050-17 and 1050-18 having an output of either one thereof connected to an input of the other one thereof, an inverter 1050-19 inverting a signal output from the inverter 1050-18, and a transfer gate 1005-7 connected to an output (node N21) of the inverter 1050-19.

The third stage of the latch circuits includes inverters 1050-20 and 1050-21 having an output of either one thereof connected to an input of the other one thereof, an inverter 1050-22 inverting a signal output from the inverter 1050-21, and a transfer gate 1005-8 connected to an output (node N31) of the inverter 1050-22. The forth stage of the latch circuits includes inverters 1050-23 and 1050-24 having an output of either one thereof connected to an input of the other one thereof, an inverter 1050-25 inverting a signal output from the inverter 1050-24, and a transfer gate 1005-9 connected to an output (node N41) of the inverter 1050-25. By the same token, the n-th stage of the latch circuits includes inverters 1050-n-2 and 1050-n-1 having an output of either one thereof connected to an input of the other one thereof, an inverter 1050-n inverting a signal output from the inverter 1050-n-1, and a transfer gate 1005-n connected to an output (node Nn1) of the inverter 1050-n.

In FIG. 19, the n-th-stage transfer gate 1005-n-5 is connected to the first-stage transfer gate 1005-1 via an inverter 1050-13. Further, the n-th transfer gate 1005-n in the plurality of stages of latch circuits is connected to the first transfer gate 1005-6 via an inverter 1050-26.

As shown in FIGS. 20A through 20C, the stop signal STOP is supplied one clock cycle after the start signal START with reference to clock cycles of the first input-clock signal CLK1, and closes the transfer gates 1005-1 through 1005-n-5 connected to the respective nodes N10 through Nn0. In this embodiment, as shown in relevant portions of FIGS. 20A through 20E and FIGS. 21A through 21F, the start signal START has already reached the node N30 by the time the stop signal STOP is supplied, so that the delay amount equivalent to one clock cycle of the external clock signal is ascertained to correspond to four stages of the delay circuits. After the transfer gates 1005-1 through 1005-n-5 are closed, the latch circuits hold the nodes Nl1 through N31 at a HIGH level. Also, the latch circuits hold the nodes N41 and the following nodes at a LOW level.

As shown in relevant portions of FIGS. 20A through 20E and FIGS. 21A through 21F, the gate signal GATE is supplied two clock cycles after the start signal START and one clock cycle after the stop signal STOP with reference to the clock cycles of the first input-clock signal CLK1. The gate signal GATE temporarily opens the transfer gates 1005-6 through 1005-n connected to the respective nodes N11 through Nn1. Signals passing through the transfer gates 1005-6 through 1005-n are supplied to the delay-control circuit 1040 (via respective nodes N1 through Nn).

In the following, other elements besides the DLL-control circuit and the clock-cycle-measurement unit will be described with regard to a circuit structure and operations thereof. In detail, the first and second variable-delay circuits, the delay-control circuit, and the phase-comparison circuit will be described with regard to a circuit structure and operations thereof.

FIG. 22 is a circuit diagram showing a portion of the variable-delay circuits shown in FIG. 15. In detail, FIG. 22 shows a portion of a delay circuit which corresponds to one stage of delay elements with respect to each of the first variable-delay circuit 1021 and the second variable-delay circuit 1022 (hereinafter, referred simply as the variable-delay circuit). FIGS. 23A through 23F are timing charts for explaining operations of the one stage of delay elements. FIG. 24 is a circuit diagram showing a circuit structure obtained by connecting one stage of delay elements one after another in series.

As shown in FIG. 22, one stage of the delay circuit includes two NAND circuits 1201 and 1202 and an inverter 1203. Operations of this circuit will be explained below with reference to FIGS. 23A through 23F.

An input signal WE is an activation signal, and is HIGH (the same level as power voltage Vcc) when this one stage of the delay circuit needs to operate. FIG. 23A shows that the input signal ΦE is HIGH, thereby making the one stage of the delay circuit ready to receive another input signal. This signal is a signal IN shown in FIG. 23B. ΦN is a signal supplied to this stage from an adjacent stage provided on the right when a plurality of stages are connected in series. OUT is an output signal of this stage of the delay circuit. FIGS. 23C and 23E (2a-1 and 2a-2) show signals observed at corresponding internal nodes in FIG. 22. Here, the signal OUT of this stage in turn becomes the signal ΦN of the next stage.

When the signal ΦN is LOW, the output signal OUT is always LOW. When the signal ΦN is HIGH and the input signal ΦE is LOW, the output signal OUT is HIGH. When the signal ΦN is HIGH and the input signal ΦE is also HIGH, the output signal OUT is HIGH if the input signal IN is LOW, and is LOW if the input signal IN is HIGH. FIGS. 23A through 23F show a case in which a change from LOW to HIGH in the input signal IN is inverted and propagates to the output side by passing through the NAND gates 1201 and 1202 and the inverter 1203 to finally become the output signal OUT when ΦE and ΦN are HIGH.

FIG. 24 shows a circuit configuration of the delay circuit in which one stage of the delay circuit shown in FIG. 22 is connected one after another in series. Only three stages are shown in FIG. 24, but a larger number of stages are actually employed in practice. A signal line which conveys the activation signal ΦE is provided with respect to each stage, and a plurality of activation signals ΦE-1, ΦE-2, and ΦE-3 are thus supplied. These activation signals are controlled by the delay-control circuit 1040.

In the example of the figure, the center stage is activated because the activation signal ΦE-2 is HIGH. In this case, when the input signal IN is changed from LOW to HIGH, the change in the input signal IN is stopped from propagating at the NAND circuits 1201-1 and 1201-3 as illustrated by a thick solid lines in the figure. This is because the activation signals ΦE-1 and ΦE-3 supplied to the left stage and the right stage, respectively, are LOW. Since the activation signal ΦE-2 for the center stage is HIGH, the change in the input signal IN passes through the NAND circuit 1201-2. The output signal OUT of the right stage is HIGH, so that the change in the input signal IN makes its way through the NAND circuit 1202-2. As a result, the change in the input signal IN appears as a change to LOW in the output signal OUT. As previously described, the output signal OUT of a given stage is always LOW if the signal ΦN input thereto is LOW. The change to LOW in the output signal OUT, therefore, is passed on to a next stage, and propagates through a plurality of stages comprised of NAND circuits and inverters until it is output as a final output signal.

In this manner, the input signal IN propagates through a plurality of stages after making an entry at the activated one of the stages, and becomes the final output signal OUT. Depending on which one of the activation signals is selected to become HIGH, therefore, the amount of delay introduced to the final output signal OUT is changed. A delay of one stage is tantamount to a total signal-propagation time of a signal passing through the NAND circuit and the inverter, and constitutes a unit time of the delay length of the DLL circuit. A total delay introduced by the DLL circuit is the delay of one stage (unit time) multiplied by the number of stages that a signal passes through.

Figure 25:
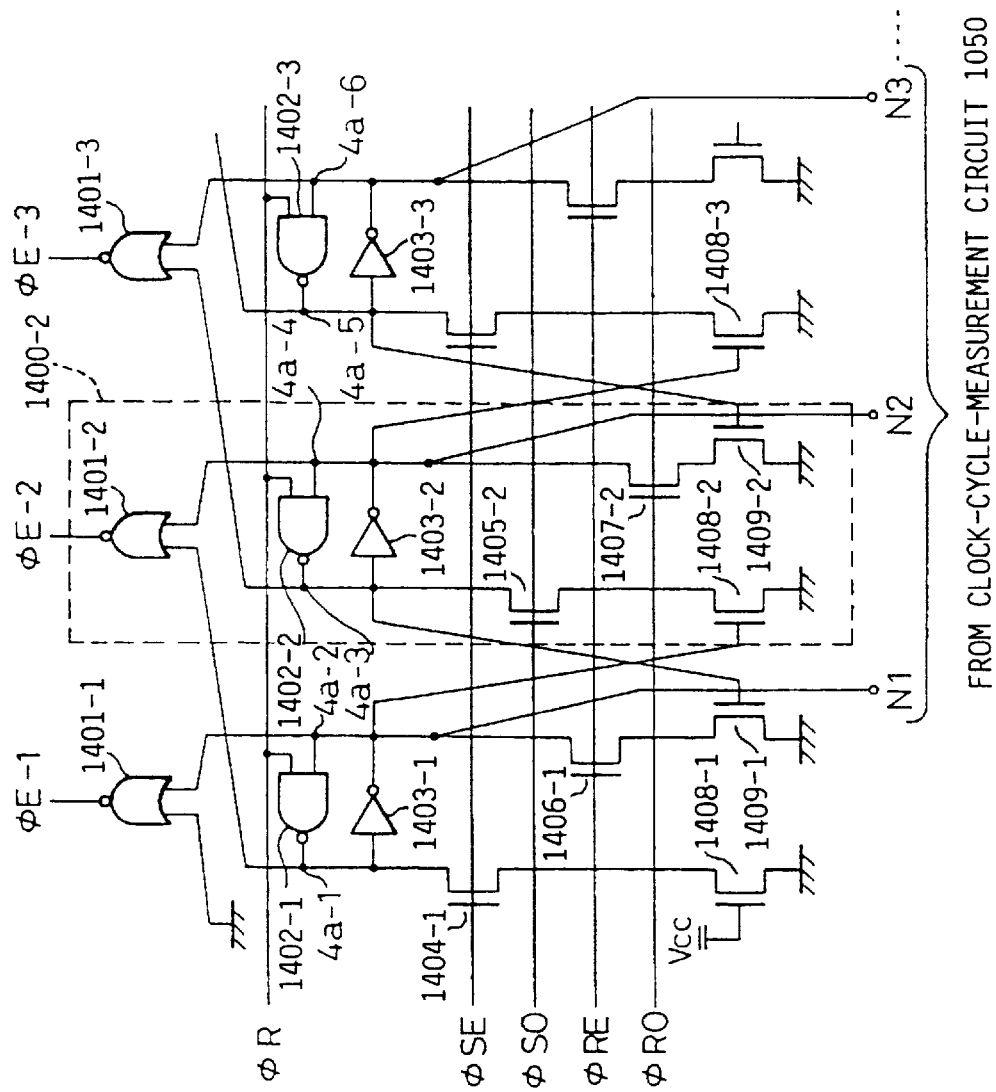
FIG. 25 is a circuit diagram showing a configuration of a delay-control circuit shown in FIG. 15.
Figure 26:
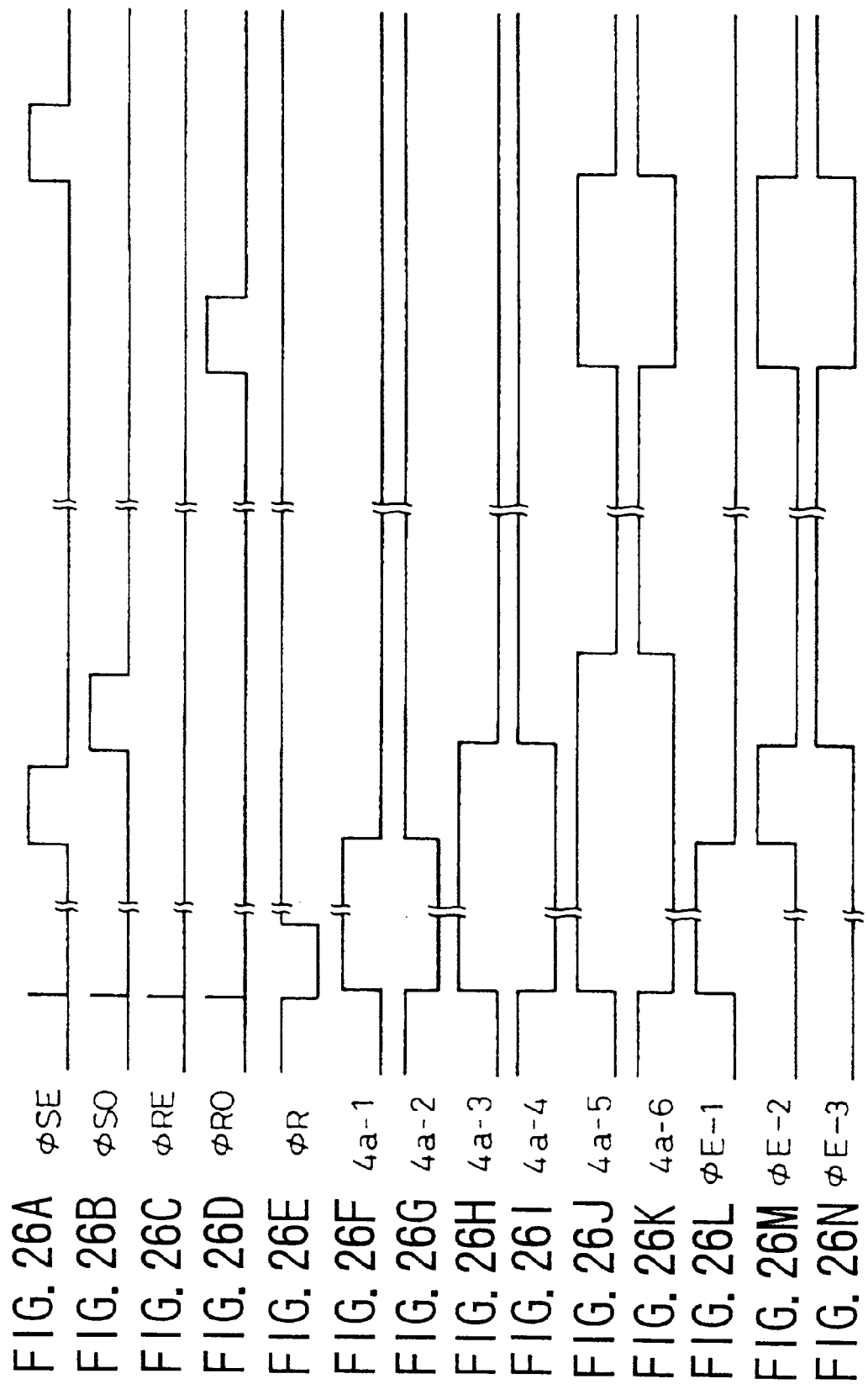
FIG. 26A through 26N are timing charts for explaining operations of the delay-control circuit of FIG. 25.

FIG. 25 is a circuit diagram showing a configuration of the delay-control circuit shown in FIG. 15. FIG. 26A through 26N are timing charts for explaining operations of the delay-control circuit of FIG. 25.

A shown in FIG. 25, the delay-control circuit is comprised of a plurality of stages in which one stage of delay-control circuit such as placed in a dashed-line box and identified as 1400-2 in the figure is connected one after another in series. An output of each stage is a respective activation signal ΦE, which is supplied to a corresponding stage of the delay circuit.

The one stage of the delay-control circuit 1400-2 includes a NAND gate 1402-2 and an inverter 1403-2 together forming a flip-flop. The stage further includes transistors 1405-2 and 1408-2 and transistors 1407-2 and 1409-2, which are connected in series on either side of the flip-flop, and further includes a NOR gate 1401-2. The gate node of the transistor 1408-2 is connected to a node 4a-2 of an adjacent stage provided on the left, and the gate node of the transistor 1409-2 is connected to a node 4a-5 of an adjacent stage situated on the right, so that these gate nodes receive signals from the adjacent stages. Further, transistors 1405-2 and 1407-2 have a gate node thereof receiving a set signal ΦSO and a reset signal ΦRO, respectively. As shown in the figure, corresponding transistors in the adjacent stages are respectively connected to another set signal ΦSE and another reset signal ΦRE. In this manner, these transistors in every even stage are connected to the set signal ΦSE and the reset signal ΦRE, and the transistors in every odd stage are connected to the set signal ΦSO and the reset signal ΦRO. The NOR circuit 1401-2 receives one input thereof from a node 4a-1 of the NAND gate 1402-1 in the adjacent stage situated on the left, and receives the other input thereof from a node 4a-4 of the current stage. A reset signal ΦR is used for resetting the delay-control circuit. The reset signal ΦR temporarily becomes LOW when power is turned on, and remains HIGH thereafter.

In FIG. 25, signals appearing at the nodes N1 through N3 of the clock-cycle-measurement unit 1050 (see FIG. 19) are supplied to output nodes of the inverters 1403-1 through 1403-3, respectively. (Only three signals are shown in the figure because there are only three stages shown in the figure.) In this embodiment, the nodes N1 through N3 exhibit a HIGH level, and the node N4 and the following nodes are at a LOW level, so that a NOR circuit 1401-4 (not shown) will have an output thereof being HIGH as an activation signal ΦE-4. As a result, the first variable-delay circuit 1021 will have a delay thereof set to a length equivalent to four stages of the delay circuit, and such a delay represents one clock cycle of the external clock signal.

In the timing charts of FIGS. 26A through 26N, the reset signal ΦR is first set to LOW for a moment, so that the nodes 4a-1, 4a-3, and 4a-5 are reset to HIGH, and the nodes 4a-2, 4a-4, 4a-6 are reset to LOW. When there is a need to count up, the set signals ΦSE and ΦSO serving as count-up signals are switched between HIGH and LOW in turn. When the set signal ΦSE is changed from LOW to HIGH, the node 4a-1 is connected to the ground, and is forced to change to LOW. The node 4a-2 changes to HIGH in response. Responding to the change at the node 4a-2, the activation signal ΦE-1 changes from HIGH to LOW. This condition is latched by the flip-flop, so that the activation signal ΦE-1 remains at LOW even after the set signal ΦSE returns to LOW.

Further, responding to the signal change to LOW at the node 4a-1, the activation signal ΦE-2 turns from LOW to HIGH. Since the node 4a-2 is HIGH, the transistor 1408-2 is in a turned-on condition. When the set signal ΦSO is changed from LOW to HIGH, the node 4a-3 is connected to the ground, and is forced to change to LOW, so that the node 4a-4 turns into HIGH. Responding to the change to HIGH at the node 4a-4, the activation signal ΦE-2 changes from HIGH to LOW. This condition is kept by the flip-flop, so that the activation signal ΦE-2 remains LOW even after the set signal ΦSO returns to LOW.

Responding to the signal change to LOW at the node 4a-3, the activation signal ΦE-3 turns from LOW to HIGH. In FIGS. 26A through 26N, only one or two pulses are supplied as the set signals ΦSE and ΦSO. The delay-control circuit is actually comprised of a large number of stages, so that when the set signals ΦSE and ΦSO are repeatedly switched between LOW and HIGH in turn, a position where the activation signal E is HIGH is shifted to the right one by one. Namely, when the phase comparison of the phase-comparison circuit 1030 indicates a need to increase a delay, for example, pulses should be supplied as the set signals ΦSE and ΦSO in turn.

If the set signals ΦSE and ΦSO for counting up and the reset signals ΦRE and ΦRO for counting down are not output at all, i.e., remain at LOW, then, a position where the activation signal ΦE is HIGH stays still. Accordingly, when the phase comparison of the phase-comparison circuit 1030 indicates a need to maintain a current delay amount, for example, no pulse should be supplied as the set signals ΦSE and ΦSO or the reset signals ΦRE and ΦRO.

In the case of counting down, pulses of the reset signals ΦRE and ΦRO are supplied. In this case, a position where the activation signal ΦE is HIGH is shifted to the left one by one, i.e., moves opposite to when a count-up operation is performed.

In this manner, the delay-control circuit of FIG. 25 shifts a position one by one with regard to where the activation signal ΦE is HIGH in response to pulses supplied thereto. The activation signal ΦE is used for controlling the variable-delay circuit shown in FIG. 24, thereby adjusting a delay amount by a unit time of delay.

In what follows, a more detailed description will be provided with regard to the delay circuit and the delay-control circuit. In the previous embodiment, the delay circuit as shown in FIG. 24 was used under the control of the delay-control circuit as shown in FIG. 25. In order to implement a circuit which can adjust a delay by a unit time, a delay line having a plurality of stages connected in series is typically used, such that selection of a point where an output signal is extracted from the delay line allows a delay amount to be controlled. In such a delay line, a care must be taken to insure that at least one of two adjacent stages outputs a signal when a transition is made from one of the two adjacent stages to the other one of the two adjacent stages. Because of such a requirement, a delay-control circuit for controlling the delay line as described above must keep outputting at least one of two adjacent activation signals when a transition is made between these two signals.

The delay-control circuit shown in FIG. 25, a flip-flop at each stage outputs two complementary signals. That is, an output of the NAND gate and an output of the inverter are complementary to each other. A given combination of the two complementary signals is output up to a certain stage, and a reversed combination of two complementary signals is output from stages thereafter. With this configuration, a stage which has the first reversed combination is shifted in terms of a position thereof. In other words, the delay-control circuit of FIG. 25 performs the same operation as a shift register. In the delay-control circuit of FIG. 25, a NOR gate is used for obtaining an inverse of a logic sum of two signals where one of the two signals is a first signal of the two complementary signals of a given stage, and the other one of the two signals is a second signal of the two complementary signals of an adjacent stage. Then, the output of the NOR gate is supplied to a corresponding stage of the variable-delay circuit shown in FIG. 24. MOS transistors used in the embodiment of the present invention has a faster transition speed in a signal change from HIGH to LOW of a falling edge than in a signal change from LOW to HIGH of a rising edge. In the delay-control circuit of FIG. 25, a NOR gate indicating a selected position in the delay line has two inputs thereof being LOW. One of these two inputs changes to HIGH at a relatively low speed, while an input to the next NOR gate changes to LOW at a relatively high speed when this NOR gate is to indicate a new selected position in the delay line. Because of this, the NOR gate which is to indicate a new selected position begins indicating the new selected position before the NOR gate which indicates a previous selected position stops outputting a selection signal. In this manner, an undesirable condition in which none of the NOR gates is indicating a selected position can be avoided.

In the following, a configuration and operations of the phase-comparison circuit 1030 shown in FIG. 15 will be described. The phase-comparison circuit 1030 includes two circuit units, i.e., a phase-comparison unit and an amplifier circuit.

Figure 27:
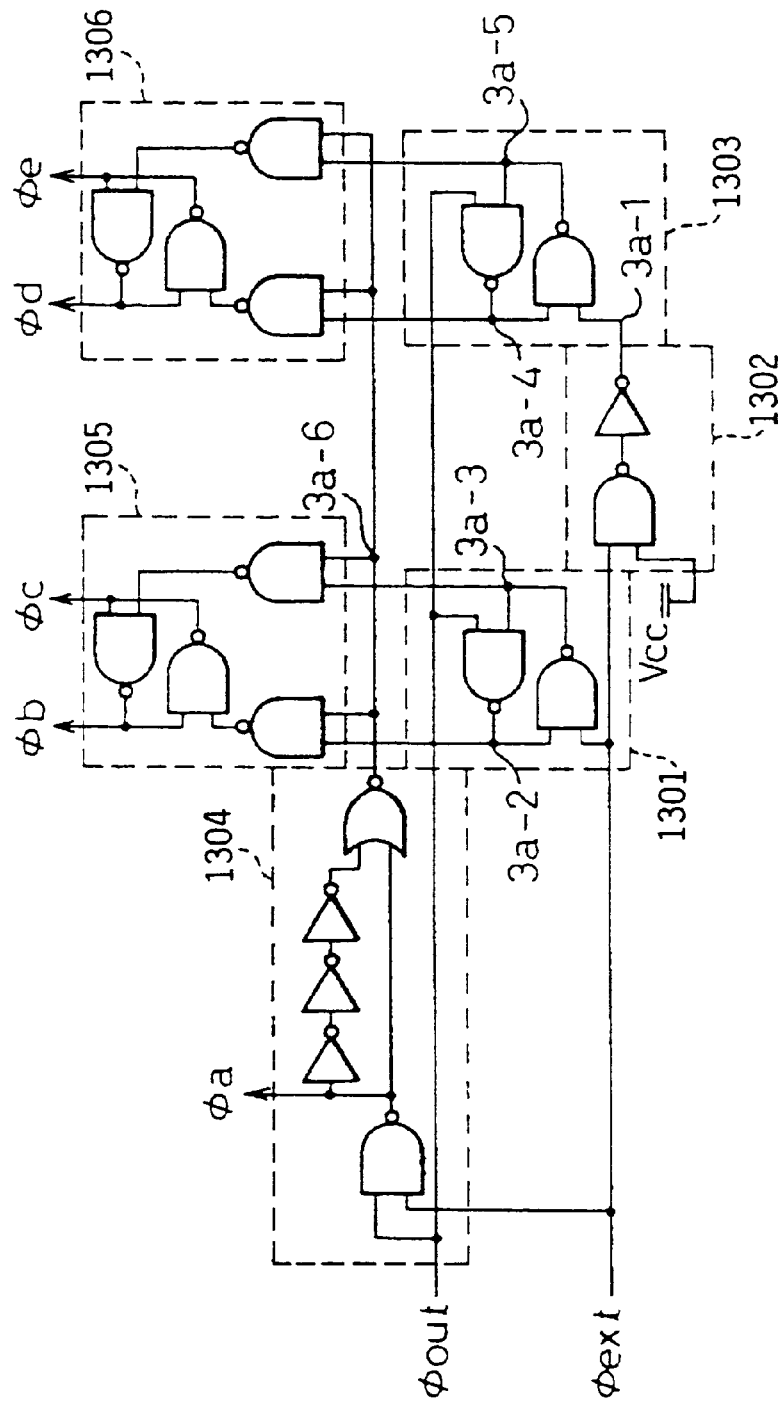
FIG. 27 is a circuit diagram showing a configuration of a phase-comparison unit of a phase-comparison circuit.
Figure 31:
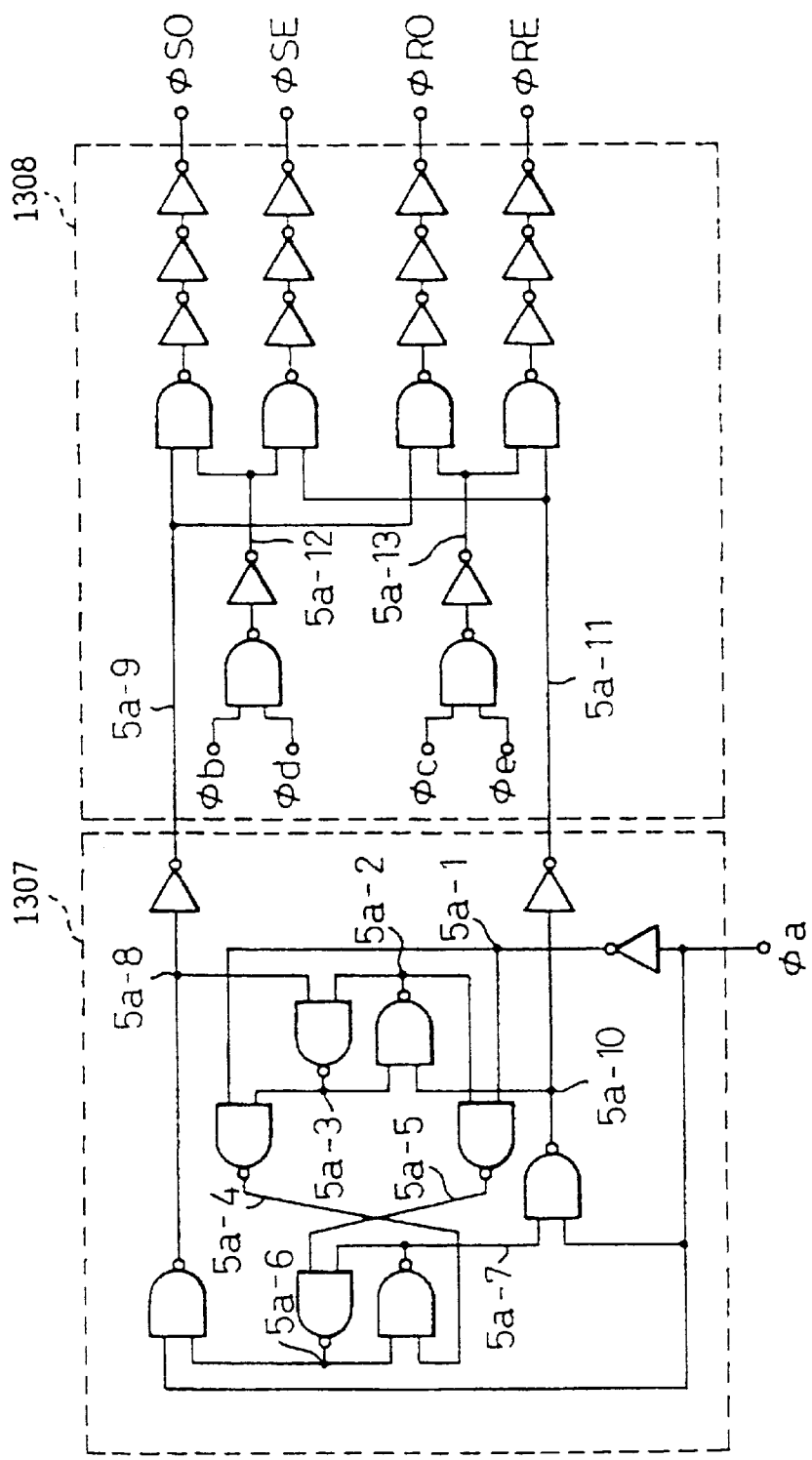
FIG. 31 is a circuit diagram showing a configuration of an amplifier unit of the phase-comparison circuit.

FIG. 27 is a circuit diagram showing a configuration of the phase-comparison unit of the phase-comparison circuit 1030. FIGS. 28A through 28M are timing charts for explaining operations of th phase-comparison unit of the phase-comparison circuit 1030. FIGS. 29A through 29M are further timing charts for explaining operations of th phase-comparison unit of the phase-comparison circuit 1030. FIGS. 30A through 30M are yet further timing charts for explaining operations of th phase-comparison unit of the phase-comparison circuit 1030. FIG. 31 is a circuit diagram showing a configuration of the amplifier unit of the phase-comparison circuit 1030. FIG. 32A through 32L are timing charts for explaining operations of the amplifier unit of the phase-comparison circuit 1030. FIG. 33A through 33K are timing charts for explaining count-up operations of the amplifier unit of the phase-comparison circuit 1030. FIG. 34A through 34K are timing charts for explaining count-stay operations of the amplifier unit of the phase-comparison circuit 1030. FIG. 35A through 35K are timing charts for explaining count-down operations of the amplifier unit of the phase-comparison circuit 1030.

In FIG. 27, two signals compared by the phase-comparison circuit 1030 are denoted as an output signal rout (corresponding to the internal clock signal) and an external clock signal Φext (corresponding to the second input-clock signal CLK2) for the purpose of providing a general description of a configuration and operations.

Using the external clock signal Φext as a reference, a check is made with regard to a phase of the output signal Φout. Signals Φa through Φe are output signals supplied to the amplifier unit. As shown in FIG. 27, the phase-comparison unit of the phase-comparison circuit 1030 includes flip-flop circuits 1301 and 1303, each of which is comprised of two NAND gates, and latch circuits 1305 and 1306 for latching signals supplied form the flip-flop circuits 1301 and 1303, respectively. The phase-comparison unit further includes a circuit 1304 for generating signals activating these latch signals and a delay circuit 1302 which serves to provide a phase tolerance margin for the external clock signal Φext.

FIGS. 28A through 28M show a case in which the output signal Φout subjected to a phase comparison is ahead of the external clock signal Φext in terms of a phase thereof when the external clock signal Φext is provided as a reference, and is changed from LOW to HIGH earlier than a corresponding change in the external clock signal Φext. When both the output signal Φout and the external clock signal Φext are LOW, nodes 3a-2, 3a-3, 3a-4, and 3a-5 in the flip-flop circuits 1301 and 1303 are HIGH. When the output signal Φout is changed from LOW to HIGH, the nodes 3a-2 and 3a-4 exhibit a respective change from HIGH to LOW. After this, the external clock signal Φext changes from LOW to HIGH, so that the node 3a-1 turns from LOW to HIGH after a delay of one unit time. Since the statuses of the flip-flops have been already fixed, no change takes place as to the statuses.

As a result, the nodes 3a-2, 3a-3, 3a-4, and 3a-5 are LOW, HIGH, LOW, and HIGH, respectively. In response to a change from LOW to HIGH in the external clock signal Φext, the circuit 1304 has the output signal Φa thereof changed from LOW to HIGH, so that the node 3a-6 receives a pulse signal temporarily showing a HIGH level. A signal appearing at the node 3a-6 is supplied to the NAND gates of the latch circuits 1305 and 1306, thereby placing these NAND gates in a temporarily active condition. AS a result, the output voltage levels of the flip-flop circuits 1301 and 1303 are taken in by the latch circuits 1305 and 1306. The output signals Φb, Φc, Φd, and Φe are thus HIGH, LOW, HIGH, and LOW, respectively.

FIGS. 29A through 29M show a case in which the output signal Φout subjected to a phase comparison has almost the same phase as the external clock signal Φext serving as a reference, and these two signals change from LOW to HIGH almost concurrently. Namely, what is shown in the figures relates to a case where a rising edge of the external clock signal Φext and a rising-edge observed at the node 3a-1 has such a timing gap as to encompass a change from LOW to HIGH in the output signal Φout. In this case, the external clock signal Φext first changes from LOW to HIGH, so that the node 3a-3 in the flip-flop circuit 1301 changes from HIGH to LOW. At the instance this happens, the node 3a-1 is still staying at a LOW level, so that the node 3a-4 in the flip-flop circuit 1303 turns from HIGH to LOW. After this, the node 3a-1 changes from LOW to HIGH. Since the status of the flip-flop circuit 1303 is already fixed by this time, however, there is no change as to the status of the flip-flop circuit 1303. Then, the node 3a-6 exhibits a HIGH level for a moment, thereby making the latch circuits store the fixed statuses of the flip-flop circuits. As a result, the output signals Φb, Φc, Φd, and Φe are LOW, HIGH, HIGH, and LOW, respectively.

FIGS. 30A through 30M show a case in which the output signal Φout subjected to a phase comparison is behind in phase relative to the external clock signal Φext serving as a reference, and the output signal Φout changes from LOW to HIGH after the external clock signal Φext makes a corresponding change. In this case, the external clock signal Φext is a critical factor prompting a status change in the flip-flop circuits 1301 and 1303, so that the nodes 3a-3 and 3a-5 change from HIGH to LOW. As a result, the output signals Φb, Φc, Φd, and Φe are LOW, HIGH, LOW, and HIGH, respectively.

In this manner, the external clock signal Φext serves as a reference, and a check is made as to whether the output signal Φout changes to HIGH before, almost at the same time as, or after a rising edge of the external clock signal Φext.

Results of the above-mentioned check is latched to generate the output signals Φb, Φc, Φd, and Φe. Based on these output signals, a check is made in turn as to whether to count up the delay-control circuit or to count down the delay-control circuit.

FIG. 31 shows a circuit structure of the amplifier circuit of the phase-comparison circuit 1030 (FIG. 15). The amplifier circuit includes a JK-flip-flop 1307 and an amplifier unit 1308 comprised of NAND gates and inverters. The JK-flip-flop 1307 receives the output signal Φa from the phase-comparison unit of FIG. 27, and outputs signals from nodes 5a-9 and 5a-11 such that these signals alternate between LOW and HIGH in turn based on the alternating signal levels of the output signal Φa. The amplifier unit 1308 receives the signals output from the JK-flip-flop 1307 and the output signals Φb through Φd supplied from the phase-comparison unit, and generates outputs based on the received signals.

Operations of the JK-flip-flop 1307 will be described first with reference to the timing charts shown in FIGS. 32A through 32L. The output signal Φa changes from HIGH to LOW at a time T1. In response, nodes 5a-1 and 5a-10 change from LOW to HIGH. Upon the signal-level change at the node 5a-1, changes take place at nodes 5a-5, 5a-6, and 5a-7. Since the output signal Φa is LOW, however, no change is observed at a node 5a-8. Because of this, a node 5a-9 exhibits no change in a signal level thereof while a node 5a-11 changes from HIGH to LOW.

Then, the output signal Φa changes from LOW to HIGH at a time T2. On the contrary to the operations described above, the node 5a-8 change from HIGH to LOW, whereas the node 5a-7 shows no change and so does the node 5a-10. As a result, the node 5a-9 changes from LOW to HIGH while the node 5a-11 exhibits no change. Operations at timings T3, T4, and thereafter are the same. In this manner, the JK-flip-flop circuit 1307 generates signals at the nodes 5a-9 and 5a-11 such that these signals alternate between HIGH and LOW in turn in response to the alternating signal levels of the output signal Φa.

In what follows, operations of the amplifier unit 1308 will be described with reference to FIGS. 33A through 33K, FIGS. 34A through 34K, and FIGS. 35A through 35K. FIGS. 33A through 33K show a case in which the output signal Φout subjected to a phase comparison changes from LOW to HIGH earlier than the external clock signal Φext serving as a reference signal. In this case, the output signals Φb, Φc, Φd, and Φe supplied from the phase-comparison unit are HIGH, LOW, HIGH, and LOW, respectively.

In this case, a node 5a-12 is fixed at a HIGH level, and a node 5a-13 is fixed at a LOW level. Because of this, the set signals ΦSO and ΦSE are changed in response to status changes of the JK-flip-flop 1307, whereas the reset signals ΦRO and ΦRE do not change since the node 5a-13 is LOW.

FIGS. 34A through 34K illustrate a case in which the output signal Φout subjected to a phase comparison changes from LOW to HIGH almost at the same time as the external clock signal Φext serving as a reference signal. In this case, the output signals Φb, Φc, Φd, and Φe supplied from the phase-comparison unit are LOW, HIGH, HIGH, and LOW, respectively. With these output signals Φb, Φc, Φd, and Φe, the nodes 5a-12 and 5a-13 are fixed at a LOW level. Because of this, the set signals ΦSO and ΦSE is not affected by the status changes of the JK-flip-flop 1307. That is, the set signals ΦSO and ΦSE as well as the reset signals ΦRO and ΦRE do not change, and remain at the LOW level.

FIGS. 35A through 35K illustrate a case in which the output signal Φout subjected to a phase comparison changes from LOW to HIGH after a rising edge of the external clock signal Φext serving as a reference. In this case, the output signals Φb, Φc, Φd, and Φe supplied from the phase-comparison unit are LOW, HIGH, LOW, and HIGH, respectively. With these output signals Φb, Φc, Φd, and Φe, the node 5a-12 is fixed at a LOW level, and the node 5a-13 is fixed at a HIGH level. Because of this, the reset signals ΦRO and ΦRE are changed in response to status changes of the JK-flip-flop 1307, whereas the set signals ΦSO and ΦSE do not change since the node 5a-12 is LOW.

The above description has been provided with reference to an example in which the clock-phase-adjustment circuit of the present invention is implemented as a DLL circuit, and is applied to a high-speed memory system such as an SDRAM. The present invention is not limited to a particular circuit configuration of such an example, but is applicable to any type of semiconductor devices.

According to the present invention, when the semiconductor device is not in the normal-operation mode, the clock-cycle-measurement unit measures a delay length equivalent to a predetermined number of clock cycles of the external clock signal, and a delay of the variable-delay circuit or the like is set to this delay length so as to be sufficiently close to a proper delay for achieving a lock-on state. Therefore, a time period required for achieving a lock-on state can be greatly reduced.

Further, according to the present invention, supply of the external clock signal to the delay-circuit unit and the phase-comparison-circuit unit is suspended for a fixed time period after the power on of the semiconductor device, and the delay length equivalent to the predetermined number of clock cycles of the external clock signal is measured during this period, so that a delay of the variable-delay circuit or the like is set to this delay length sufficiently close to a proper delay for achieving a lock-on state. Therefore, malfunction of the DLL circuit or the like at the time of power on can be avoided, and a time period required for achieving a lock-on state can be greatly reduced.

Moreover, according to the present invention, supply of the external clock signal to the delay-circuit unit and the phase-comparison-circuit unit is suspended for a fixed time period after the switching of an operation mode in the semiconductor device, and the delay length equivalent to the predetermined number of clock cycles of the external clock signal is measured during this period, so that a delay of the variable-delay circuit or the like is set to this delay length sufficiently close to a proper delay for achieving a lock-on state. Therefore, the DLL circuit or the like does not suffer any negative influence from the switching of an operation mode, and a time period required for achieving a lock-on state can be greatly reduced.

Further, according to the present invention, the delay of the variable-delay circuit is brought sufficiently close to a proper delay for achieving a lock-on state through a single giant step immediately after the power on of the semiconductor device, and, then, a fine adjustment of the delay is performed in the variable-delay circuit. Therefore, the DLL circuit or the like can avoid malfunction thereof caused by the power on of the semiconductor device, and can achieve a highly-accurate-yet-speedy phase adjustment of the internal clock signal.

Further, according to the present invention, the delay of the variable-delay circuit is brought sufficiently close to a proper delay for achieving a lock-on state through a single giant step immediately after a return from the standby mode in the semiconductor device, and, then, a fine adjustment of the delay is performed in the variable-delay circuit. Therefore, the DLL circuit or the like can avoid malfunction thereof caused by the return from the standby mode of the semiconductor device, and can achieve a highly-accurate-yet-speedy phase adjustment of the internal clock signal.

Further, the present invention is not limited to these embodiments, but various variations and modifications may be made without departing from the scope of the present invention.

What is claimed is:

1. A semiconductor device, comprising:
   a variable-delay circuit which adjusts a delay of an input clock signal by changing a number of delay elements having said input clock signal passing therethrough so as to generate a delayed clock signal;
   a timing-stabilization circuit including:
   a phase comparator which compares phases between the delayed clock signal and the input clock signal; and
   a delay-control circuit which controls the delay based on the phase comparison of said phase comparator by changing said number of delay elements by one stage in a first condition and by more than one stage in a second condition.

2. The semiconductor device as claimed in claim 1, wherein said timing-stabilization circuit is set to operate in said second condition in response to at least one of a start of power supply to said semiconductor device and switching of operation modes of said semiconductor device.

3. The semiconductor device as claimed in claim 2, wherein said timing stabilization circuit is such that a switch is made from said second condition to said first condition when said delay comes to a predetermined proximity of a desired delay through successive shifts of more than one stage at a time in said second mode.

4. The semiconductor device as claimed in claim 2, further comprising a power-on-detection circuit which detects said start of power supply to generate a signal indicative thereof, wherein said timing-stabilization circuit is set in said second condition in response to said signal from said power-on-detection circuit.

5. The semiconductor device as claimed in claim 2, further comprising a return-detection circuit which detects a return from a reduced-power-consumption mode to a normal-operation mode to generate a signal indicative thereof, wherein said timing-stabilization circuit is set in said second mode in response to said signal from said return-detection circuit.

6. The semiconductor device as claimed in claim 3, wherein said timing-stabilization circuit includes:
   a dummy-variable-delay circuit which is controlled to introduce the same delay as that of said variable-delay circuit;
   a dummy circuit which delays a clock signal supplied from said dummy-variable-delay circuit;
   a phase comparator which compares phases between a clock supplied from said dummy circuit and said input clock signal; and
   a delay-control circuit which controls said delay based on phase comparison of said phase comparator by changing said number of delay elements by one stage in said first condition and by more than one stage in said second condition with respect to said variable- delay circuit and said dummy-variable-delay circuit.

7. The semiconductor device as claimed in claim 6, wherein said timing-stabilization circuit further includes a delay-control-switch circuit which sets said delay-control circuit in said second condition in response to at least one of said start of power supply and said switching of operation modes, and sets said delay-control circuit in said first mode in accordance with said phase comparison of said phase comparator.

8. The semiconductor device as claimed in claim 7, wherein said delay-control-switch circuit sets said delay-control circuit in said first condition when said phase comparison of said phase comparator indicates a lock-on status or a reversal of a shift direction of said delay.

9. A semiconductor device including a clock-phase-adjustment circuit which adjusts a phase of an external clock signal externally provided so as to generate an internal clock signal, said clock-phase-adjustment circuit comprising:
   a delay-circuit unit which delays said external clock signal by an adjustable delay length so as to generate said internal clock signal;
   a phase-comparison-circuit unit which compares said external clock signal with a signal responsive to said internal clock signal in terms of phases thereof;
   a delay-control-circuit unit which adjusts said adjustable delay length based on a phase comparison by said phase-comparison-circuit unit; and
   a clock-cycle-measurement unit which measures a delay length equivalent to a predetermined number of clock cycles of said external clock signal, and supplies the measurement of said delay length to said delay-control-circuit unit,
   wherein said delay-control-circuit unit sets said adjustable delay length to said delay length equivalent to a predetermined number of clock cycles of said external clock signal during a period when supply of said external clock signal to said phase-comparison-circuit unit is suspended.

10. The semiconductor device as claimed in claim 9, further comprising a clock-phase-adjustment-circuit control unit which suspends said supply of said external clock signal to said phase-comparison-circuit unit during a predetermined time period after a start of power supply to said semiconductor device.

11. The semiconductor device as claimed in claim 9, further comprising a clock-phase-adjustment-circuit control unit which suspends said supply of said external clock signal to said phase-comparison-circuit unit during a predetermined time period after switching of an operation mode of said semiconductor device.

12. The semiconductor device as claimed in claim 10, wherein a phase adjustment of said external clock signal is made based on said measurement of said delay length immediately after said start of power supply, and is made based on said phase comparison by said phase-comparison-circuit unit thereafter.

13. The semiconductor device as claimed in claim 11, wherein a phase adjustment of said external clock signal is made based on said measurement of said delay length immediately after a return from a standby mode, and is made based on said phase comparison by said phase-comparison-circuit unit thereafter.

14. A semiconductor device comprising:
   a variable-delay means for adjusting a delay of an input clock signal by changing a number of delay elements having said input clock signal passing therethrough so as to generate a delayed clock signal; and
   a timing-stabilization means for changing said number of delay elements by one stage in a first condition and by more than one state in a second condition to control said delay.

* * * * *